US008658885B2

(12) United States Patent
Kikuchi et al.

(10) Patent No.: US 8,658,885 B2
(45) Date of Patent: Feb. 25, 2014

(54) SUBSTRATE FOR THIN-FILM PHOTOELECTRIC CONVERSION DEVICE, THIN FILM PHOTOELECTRIC CONVERSION DEVICE INCLUDING THE SAME, AND METHOD FOR PRODUCING SUBSTRATE FOR THIN-FILM PHOTOELECTRIC CONVERSION DEVICE

(75) Inventors: Takashi Kikuchi, Otsu (JP); Toshiaki Sasaki, Otsu (JP)

(73) Assignee: Kaneka Corporation, Osaka-shi (JP)

( * ) Notice: Subject to any disclaimer, the term of this patent is extended or adjusted under 35 U.S.C. 154(b) by 468 days.

(21) Appl. No.: 12/993,467

(22) PCT Filed: May 15, 2009

(86) PCT No.: PCT/JP2009/059065
§ 371 (c)(1),
(2), (4) Date: Nov. 18, 2010

(87) PCT Pub. No.: WO2009/142156
PCT Pub. Date: Nov. 26, 2009

(65) Prior Publication Data
US 2011/0073162 A1    Mar. 31, 2011

(30) Foreign Application Priority Data

May 23, 2008    (JP) ................................. 2008-134913

(51) Int. Cl.
*H01L 31/00* (2006.01)
*B05D 1/18* (2006.01)
*B05D 3/00* (2006.01)

(52) U.S. Cl.
USPC ............. 136/249; 136/256; 427/74; 427/299; 427/443.2; 438/72

(58) Field of Classification Search
USPC ......... 257/E31.001, E31.051; 438/72, 57, 85, 438/63, 69, 685, 682; 136/244, 252, 250, 136/246, 259
See application file for complete search history.

(56) References Cited

U.S. PATENT DOCUMENTS

| 6,337,133 B1 * | 1/2002 | Akamatsu et al. ............ 428/410 |
| 6,544,893 B2 * | 4/2003 | Eto ............................... 438/693 |
| 2007/0169805 A1 | 7/2007 | Sasaki et al. |

FOREIGN PATENT DOCUMENTS

| JP | 10-326903 A | 12/1998 |
| JP | 11-330508 A | 11/1999 |

(Continued)

OTHER PUBLICATIONS

Machine transpation JP 2001-320067.*

(Continued)

*Primary Examiner* — Jeffrey T Barton
*Assistant Examiner* — Meisha Binkley
(74) *Attorney, Agent, or Firm* — Alleman Hall McCoy Russell & Tuttle LLP

(57) ABSTRACT

Provided is a substrate for a thin-film photoelectric conversion device which makes it possible to produce the device having improved characteristics at low cost and high productivity. The substrate includes a transparent base member, with a transparent underlying layer and a transparent electrode layer successively stacked on one main surface of the transparent base member. The underlying layer includes transparent insulating fine particles and transparent binder, and the particles are dispersed to cover the one main surface with a coverage factor of particles ranging from 30% or more to less than 80%. An antireflection layer is provided on the other main surface of the transparent base. The antireflection layer includes transparent insulating fine particles and transparent binder, and the particles are dispersed to cover the other main surface with a coverage factor greater than the underlying layer. The transparent electrode layer contains zinc oxide deposited by low-pressure CVD method.

10 Claims, 12 Drawing Sheets

(56) References Cited

FOREIGN PATENT DOCUMENTS

| JP | 2001-320067 A | 11/2001 |
| JP | 2003-243676 A | 8/2003 |
| JP | 2008-235687 A | 10/2008 |
| TW | 200603214 | 1/2006 |
| WO | WO 2005093854 A1 * | 10/2005 |

OTHER PUBLICATIONS

Machine translation JP 2003-243676.*
ISA Japanese Patent Office, International Search Report of PCT/JP2009/059065, Jun. 9, 2009, 2 pages.
ISA The International Bureau of WIPO, International Preliminary Report on Patentability for International Application No. PCT/JP2009/059065, Jan. 20, 2011, 5 pages.

* cited by examiner

1 μm

//ED States Patent

SUBSTRATE FOR THIN-FILM PHOTOELECTRIC CONVERSION DEVICE, THIN FILM PHOTOELECTRIC CONVERSION DEVICE INCLUDING THE SAME, AND METHOD FOR PRODUCING SUBSTRATE FOR THIN-FILM PHOTOELECTRIC CONVERSION DEVICE

TECHNICAL FIELD

The present invention relates to an improved substrate for a thin-film photoelectric conversion device, and the thin-film photoelectric conversion device including such an improved substrate, and also relates to a method for producing the substrate for a thin-film photoelectric conversion device.

BACKGROUND ART

Photoelectric conversion devices have been used in various fields such as light-receiving sensors and solar cells. Among these, the solar cells have drawn public attention as one of the energy sources that are friendly to the earth. Moreover, together with increased concerns about environmental-related issues in recent years and accelerating policies for introducing solar cells in various countries, solar cells have been widely used rapidly.

In recent years, in order to achieve both of reduced costs and high efficiency of the photoelectric conversion devices, public attention has been drawn to a thin-film photoelectric conversion device which requires less raw materials, and developments thereof have been vigorously carried out. In particular, a method for forming a good-quality semiconductor layer on an inexpensive base member such as a glass plate by using a low-temperature process has been expected as a method for achieving a photoelectric conversion device at low costs.

In the case of manufacturing a thin-film photoelectric conversion device for power with a large area capable of generating a high output with a high voltage, a structure in which a plurality of thin-film photoelectric conversion devices, each formed on a base member, are serially-connected to one another with wiring, is not used, but a structure in which, in order to provide a good yield, a thin-film photoelectric conversion layer formed on a large base member is divided into a plurality of cells so that these cells are serially-connected to one another by the use of patterning to be integrated, is generally used. For example, in the case of a thin-film photoelectric conversion device of a type that allows light to be made incident on the glass base member side, in order to reduce electrical losses due to a resistance of the transparent electrode layer on the glass base member, separation grooves that divide the transparent electrode into a plurality of strip shapes having a predetermined width are formed by using a laser scribing process, and the respective cells are serially-connected to one another in a direction perpendicular to the longitudinal direction of the strip shapes so as to be integrated.

Moreover, in order to form a thin-film photoelectric conversion device, it is indispensable to provide a transparent electrode layer as one portion thereof. That is, the thin-film photoelectric conversion device includes one or more photoelectric conversion units between the transparent electrode layer and a back electrode layer. In this case, light is made incident on the transparent electrode layer side. As the transparent electrode layer, for example, conductive metal oxides such as $SnO_2$ and ZnO are used, and the layer is formed by using a CVD method, a sputtering method, a vapor-deposition method, or the like. The transparent electrode layer is desirably provided with fine surface unevenness so as to have such an effect for increasing scattering of the incident light.

The photoelectric conversion unit is formed of semiconductor layers having a pn junction or a pin junction. In the case where the photoelectric conversion unit has the pin junction, a p-type layer, an i-type layer and an n-type layer are stacked in this order or in a reversed order thereof, and a unit including an amorphous layer as the i-type photoelectric conversion layer that occupies a main portion of its unit is referred to as an amorphous photoelectric conversion unit, and a unit including a crystalline layer as the i-type layer is referred to as a crystalline photoelectric conversion unit. An amorphous silicon layer or a crystalline silicon layer serving as a silicon-based thin film may be used as the semiconductor layer, and a thin film made of $CuInSe_2$ (abbreviated as CIS) or CdTe may be used as the compound semiconductor thin film. Note that, in the present specification, the terms "crystalline" and "microcrystalline" also mean those materials partially containing amorphous components.

A photoelectric conversion unit, included in the silicon-based thin-film photoelectric conversion device, has a pin junction formed of a p-type layer, an i-type photoelectric conversion layer substantially made of an intrinsic semiconductor, and an n-type layer. In the case where the i-type layer is made of amorphous silicon, the photoelectric conversion unit is referred to as an amorphous silicon photoelectric conversion unit, and in the case where the i-type layer is made of silicon containing crystalline components, the photoelectric conversion unit is referred to as a crystalline silicon photoelectric conversion unit. As the amorphous or crystalline silicon-based materials, not only materials containing only silicon as their main element, but also alloy materials containing carbon, oxygen, nitrogen, germanium and the like as their main elements may be used. Moreover, the conductive layer does not necessarily need to be made of the same main element as that of the i-type layer, and for example, amorphous silicon carbide may be used as the p-type layer of the amorphous silicon photoelectric conversion unit, and microcrystalline silicon (also referred to as "µc-Si layer") may be used as the n-type layer thereof.

As the back electrode layer to be formed on the photoelectric conversion unit, for example, a metal layer, such as Al or Ag, may be formed by using a sputtering method or a vapor deposition method. In general, a conductive oxide layer, such as ITO, $SnO_2$ or ZnO, is formed between the photoelectric conversion unit and the metal electrode layer.

In the amorphous silicon thin-film photoelectric conversion device, the initial photoelectric conversion efficiency is lower than that of a photoelectric conversion device that utilizes monocrystalline or polycrystalline silicon, and a problem exists in that the conversion efficiency is lowered due to a photodegradation phenomenon when irradiated with light for a long period of time. Therefore, a crystalline silicon thin-film photoelectric conversion device that utilizes a crystalline silicon thin-film, such as polycrystalline silicon and microcrystalline silicon, as its photoelectric conversion layer has been expected and developed as a device that can achieve both of a reduced production cost and high photoelectric conversion efficiency. The reason for this is because the crystalline silicon thin-film photoelectric conversion device can be formed by utilizing a low-temperature plasma enhanced CVD in the same manner as in the amorphous silicon thin-film photoelectric conversion layer and because the crystalline silicon thin-film photoelectric conversion layer hardly causes any photodegradation phenomenon. Moreover, in comparison with the amorphous silicon photoelectric conversion layer that can photoelectrically convert light having wavelengths up to about 800 nm on the long-wavelength side, the crystalline silicon photoelectric conversion layer can photoelectrically convert light having longer wavelengths up to about 1200 nm.

Moreover, as a method for improving the conversion efficiency of the thin-film photoelectric conversion device, there has been known a method in which two or more photoelectric conversion units are stacked so as to form a stacked-type thin-film photoelectric conversion device. In this method, a front unit including a photoelectric conversion layer having a large energy-band gap is placed on a light incident side of a thin-film photoelectric conversion device, and behind this front unit, rear units having smaller band gaps are successively placed so that a photoelectric conversion process can be carried out over a wide wavelength range of incident light; thus, the conversion efficiency of the entire device can be improved. Among stacked-type thin-film photoelectric conversion devices, those in which an amorphous photoelectric conversion unit and a crystalline photoelectric conversion unit are stacked are referred to as hybrid-type thin-film photoelectric conversion devices.

In the thin-film photoelectric conversion device as described above, it becomes possible to make the photoelectric conversion layer thinner in comparison with a conventional photoelectric conversion device in which a bulk monocrystalline or polycrystalline silicon substrate is utilized; however, a problem is raised in that light absorption is limited by the film thickness. Therefore, in order to more effectively utilize light that is made incident on the photoelectric conversion unit including photoelectric conversion layers, the surface of a transparent electrode layer or a metal layer that is in contact with the photoelectric conversion unit is formed (textured) into a roughened surface with fine unevenness. That is, after light has been scattered on the interface with fine unevenness, the light is made incident onto the photoelectric conversion unit so that the optical path inside the photoelectric conversion layer is made longer; thus, an attempt is made to increase the quantity of light absorption. This technique for forming the surface unevenness (surface texture) is also referred to as a "light confinement" technique, and this forms an important basic technique so as to put the thin-film photoelectric conversion device having high photoelectric conversion efficiency into practical use.

In this case, in order to find surface uneven shapes of a transparent electrode layer optimally used for the thin-film photoelectric conversion device, an index that can quantitatively indicate the surface uneven shapes has been demanded. As the index for indicating the surface uneven shapes, a haze ratio, a surface area ratio (Sdr), or the like, has been known.

The haze ratio, which represents an index used for optically evaluating surface unevenness of a transparent plate, is indicated by (diffuse transmittance/total light transmittance)×100 [%] (JIS K7136). With respect to measurements of the haze ratio, a haze meter capable of carrying out automatic measurements is commercially available, and the measurements are easily executed. In general, an illuminant C is used as a light source for the measurements.

The surface area ratio is an index capable of indicating not only height differences in the unevenness, but also shapes of the unevenness in a manner so as to be included therein. Since fluctuations of the surface unevenness of the transparent conductive film are sharpened, the open circuit voltage and fill factor of the thin-film photoelectric conversion device tend to be lowered; therefore, the surface area ratio can be effectively used as an index for indicating the surface unevenness of a transparent conductive film for a thin-film photoelectric conversion device. The surface area ratio is also referred to as "Developed Surface Area Ratio", and "Sdr" is used as its abbreviation. The Sdr is defined by equation 1 and equation 2 (K. J. Stout, P. J. Sullivan, W. P. Dong, E. Manisah, N. Luo, T. Mathia: "The development of methods for characterization of roughness on three dimensions", Publication no. EUR 15178 EN of the Commission of the European Communities, Lucembourg, 1994).

$$S_{dr} = \frac{\left(\sum_{j}^{M-1}\sum_{k}^{N-1} A_{jk}\right) - (M-1)(N-1)\Delta X \Delta Y}{(M-1)(N-1)\Delta X \Delta Y} \times 100\% \quad \text{(Equation 1)}$$

In this case, $A_{jk}$ is indicated by the following equation 2:

$$A_{jk} = \frac{1}{2}\left[\sqrt{\Delta Y^2 + \{Z(x_j, y_k) - Z(x_j, y_{k+1})\}^2} + \sqrt{\Delta Y^2 + \{Z(x_{j+1}, y_k) - Z(x_{j+1}, y_{k+1})\}^2}\right] \times \frac{1}{2}\left[\sqrt{\Delta X^2 + \{Z(x_j, y_k) - Z(x_{j+1}, y_k)\}^2} + \sqrt{\Delta X^2 + \{Z(x_j, y_{k+1}) - Z(x_{j+1}, y_{k+1})\}^2}\right] \quad \text{(Equation 2)}$$

In this case, $\Delta X$ and $\Delta Y$ respectively indicate distances of measured intervals in the X direction and Y direction.

That is, Sdr indicates a rate of an increase of a surface area relative to an area on a flat XY plane. In other words, the Sdr value becomes greater, as the height differences in the surface unevenness become greater so that each convex portion is made as sharpened as possible.

In a conventional amorphous silicon thin-film photoelectric conversion device, a tin oxide ($SnO_2$) film having surface unevenness is often used as a transparent electrode layer to be formed on a transparent base member such as a glass plate. The surface unevenness of this transparent electrode layer effectively contributes to confining light into the photoelectric conversion layer. However, although it is preferable to increase the surface unevenness so as to further enhance the light confinement effect, only the use of the $SnO_2$ film solely makes it difficult to remarkably change the shapes of the surface unevenness, while light-transmitting property and conductivity required for the photoelectric conversion device are being properly maintained.

Moreover, in the case where an $SnO_2$ film is formed on a glass plate as the transparent electrode layer having surface unevenness that is effective for the light confinement by using a normal-pressure thermal chemical vapor deposition method (normal-pressure thermal CVD method), since the thermal CVD method uses a high-temperature process in a range of about 550 to 650° C., a problem is raised in that the formation cost of the transparent electrode layer becomes high. Moreover, in the case where the film-forming temperature is high, another problem is that it becomes difficult to use inexpensive base members, such as normal glass plates and plastic films. Furthermore, when a reinforced glass plate is subjected to a high temperature process, its reinforcing effect is lost. Consequently, in the case where a base member of a glass plate is applied to a solar cell with a large area during a high-temperature process, the thickness of the glass plate needs to be increased so as to maintain its strength, causing a problem in that the glass plate becomes heavier.

Moreover, since the $SnO_2$ film is poor in plasma resistant property, the $SnO_2$ film may be reduced under a high plasma concentration containing hydrogen in a deposition environment of the photoelectric conversion layer. Since the $SnO_2$ film is blackened when reduced, incident light is absorbed by the blackened electrode layer, with the result that the quantity of transmitted light into the photoelectric conversion layer is reduced to cause a reduction in the photoelectric conversion efficiency.

On the other hand, zinc oxide (ZnO) is less expensive than $SiO_2$ or indium-tin oxide (ITO) that is widely used as a material for the transparent electrode layer, and is also advantageous in having high plasma resistant property so that it is desirably used as a material for the transparent electrode layer contained in a thin-film solar cell. In particular, in the case of a crystalline silicon thin-film photoelectric conversion device including a crystalline silicon layer, such as a thin-film polycrystalline silicon layer and a microcrystalline silicon layer, that consumes a large amount of hydrogen in comparison with deposition conditions of an amorphous silicon layer, and requires a high plasma concentration, as one portion of a photoelectric conversion unit, it is effective to use zinc oxide (ZnO) as the material for the transparent electrode layer.

Patent Document 1 (Japanese Patent Laid-Open Publication No. 2003-243676) has disclosed a structure in which an underlying layer containing insulating fine particles and a binder is formed on a glass plate so as to form a transparent electrode layer having a high light confinement effect at a low cost, and by allowing the insulating fine particles to occupy an area of 80% or more of the underlying layer, the surface unevenness of the transparent electrode layer to be formed on the underlying layer can be increased. Silica ($SiO_2$) having a particle size of 0.1 to 1 μm is used as the insulating fine particles, and a silicon oxide is used as the binder. More specifically, the underlying layer is formed by a sol-gel method using a roll coater, and a ZnO layer is formed as the transparent electrode layer by using a sputtering method.

PRIOR ART DOCUMENT

Patent Document

Patent Document 1: Japanese Patent Laid-Open Publication No. 2003-243676 (U.S. Pat. No. 3,706,835)

SUMMARY OF THE INVENTION

Problems to be Solved by the Invention

As described above, in Patent Document 1, a ZnO layer serving as a transparent electrode layer is deposited by a sputtering method. However, the sputtering method requires processes with high costs in comparison with a CVD (Chemical Vapor Deposition) method, and the CVD method is more suitable for forming a film covering a base member with a large area in comparison with the sputtering method, and also has a higher film-forming rate. Moreover, the ZnO layer deposited by the sputtering method tends to form a film having an excessively high carrier density which easily causes a film to have a low light transmittance.

From these viewpoints, the inventors attempted to deposit the ZnO layer in the invention of Patent Document 1 by using not the sputtering method, but a low-pressure thermal CVD method. As a result, a problem is raised in that, in the case where an underlying layer containing insulating fine particles and a binder on a glass plate, with an area of 80% or more of the underlying layer being occupied with insulating fine particles, a thin-film photoelectric conversion device, which has been formed so as to contain a ZnO conductive layer deposited on the underlying layer by using the low-pressure thermal CVD method, is not necessarily allowed to have high photoelectric conversion efficiency.

Therefore, the objective of the present invention is to provide a substrate on which a ZnO transparent electrode layer included in a thin-film photoelectric conversion device is deposited by a low-pressure thermal CVD method, and consequently to provide a cost reductive thin-film photoelectric conversion device with improved photoelectric conversion efficiency by using such a substrate.

In this case, on a main surface (antireflection surface) on the opposite side that is in contact with an underlying layer of a transparent base member, as the coverage factor of particles becomes smaller, the reflectance becomes higher to cause a reduction in light that is made incident on the photoelectric conversion layer, with the result that the Jsc tends to be lowered.

Note that, the term "low-pressure thermal CVD method" means a CVD method which uses a reaction gas having a pressure lower than the atmospheric pressure, and is also referred to as "pressure-reduced CVD method" or "low-pressure CVD method" (abbreviated as: "LP-CVD method"). Moreover, since the term "CVD" normally means "thermal CVD" except that its energy source, such as "plasma enhanced CVD", "photo CVD" or the like, is clarified, the term "low-pressure CVD method" is synonymous with the "low-pressure thermal CVD method". Moreover, the low-pressure thermal CVD method also includes an organic metal CVD method under reduced pressure (abbreviated as: "MO-CVD method").

Means for Solving the Problems

The first aspect of the invention is a substrate for a thin-film photoelectric conversion device including: a transparent base member; a transparent underlying layer and a transparent electrode layer that are successively stacked on an underlying surface serving as one main surface of the transparent base member; and an antireflection layer that is formed on an antireflection surface serving as the other main surface on a side opposite to the underlying surface of the transparent base member, wherein the transparent underlying layer includes transparent insulating fine particles and a transparent binder, the transparent insulating fine particles having an average particle size in a range from 50 nm to 200 nm; the transparent insulating fine particles are dispersed in a manner so as to cover the underlying surface with a coverage factor of particles in a range from 30% to 80%; the transparent electrode layer contains zinc oxide that is deposited by using a low-pressure CVD method; the antireflection layer includes transparent insulating fine particles and a transparent binder, with the transparent insulating fine particles being dispersed so as to cover the antireflection layer; and the transparent insulating fine particles in the antireflection layer have a coverage factor of particles that is greater than a coverage factor of particles of the transparent insulating fine particles in the underlying layer.

Also, the invention is the substrate for a thin-film photoelectric conversion device, wherein the coverage factor of particles of the transparent insulating fine particles in the antireflection layer is 80% or more.

Also, the invention is the substrate for a thin-film photoelectric conversion device, wherein a material for the transparent insulating fine particles contained in the antireflection layer and a material for the transparent insulating fine particles contained in the underlying layer are the same.

The second aspect of the invention is a method for manufacturing the substrate for a thin-film photoelectric conversion device, including the step of forming the transparent underlying layer and the antireflection layer simultaneously by using a dipping method.

The dipping method refers to a method in which, after a substrate has been immersed in a coating solution containing components of a film to be formed, the resulting substrate is pulled out so that thin films are formed thereon. This method is superior in productivity because films are simultaneously formed on both surfaces of the substrate, and makes it possible to form films at low costs by using a simple process. Moreover, by altering the composition of the coating solution, the composition of the film to be formed can be changed.

Also, the invention is a method for manufacturing the substrate for a thin-film photoelectric conversion device, including the steps of: washing the transparent base member; and after the step of washing the transparent base member, simultaneously forming the underlying layer and the antireflection layer by using a dipping method, wherein in the step of washing the transparent base member, conditions for washing the underlying surface of the transparent base member and conditions for washing the antireflection surface of the transparent base member are made different from each other.

Also the invention is the method for manufacturing the substrate for a thin-film photoelectric conversion device, wherein the step of washing the underlying surface of the transparent base member is carried out only by rinsing the surface with pure water, and the step of washing the antireflection surface of the transparent base member is carried out by using a Cerico washing process.

Also the invention is the method for manufacturing the substrate for a thin-film photoelectric conversion device, wherein both of the underlying surface and the antireflection surface are subjected to the Cerico washing process, with a pressing force applied onto the antireflection surface upon washing the antireflection surface being made greater than a pressing force applied onto the underlying surface upon washing the underlying surface.

Also, the invention is the method for manufacturing the substrate for a thin-film photoelectric conversion device, wherein the Cerico washing process is carried out by using a polishing buff that is impregnated with cerium oxide particles.

The third aspect of the invention is a method for manufacturing the substrate for a thin-film photoelectric conversion device, including the step of: forming the underlying layer and the antireflection layer by using a printing method, with printing conditions used upon printing the underlying layer and printing conditions used upon printing the antireflection layer being made different from each other.

Also, the invention is the method for manufacturing the substrate for a thin-film photoelectric conversion device, wherein a weight percent of transparent insulating fine particles used upon printing the antireflection layer is made greater than a weight percent of transparent insulating fine particles used upon printing the underlying layer.

The forth aspect of the invention is a thin-film photoelectric conversion device including: the substrate for a thin-film photoelectric conversion device, wherein the device further includes one or more photoelectric conversion units formed on the transparent electrode layer.

Also, the invention is the thin-film photoelectric conversion device, wherein the one or more photoelectric conversion units include an amorphous photoelectric conversion unit.

Also, the invention is the thin-film photoelectric conversion device, wherein the one or more photoelectric conversion units include a crystalline photoelectric conversion unit.

The fifth aspect of the invention is a thin-film photoelectric conversion device including: the substrate for a thin-film photoelectric conversion device, and further including one or more photoelectric conversion unit layers successively stacked on the transparent electrode layer, and a back electrode layer, wherein the transparent electrode layer, the photoelectric conversion unit layers and the back electrode layer are separated from one another by a plurality of separation grooves so as to form a plurality of photoelectric conversion cells, and the respective photoelectric conversion cells are electrically serially-connected to one another through a plurality of connection grooves.

One of important items for solving the problems is that the substrate for a thin-film photoelectric conversion device of the present invention is provided with an underlying layer, made of transparent insulating fine particles and a transparent binder, that is in contact with an underlying surface serving as one main surface of a transparent base member, and an antireflection layer, made of transparent insulating fine particles and a transparent binder, that is in contact with an antireflection surface corresponding to the other main surface of the transparent base member on the side opposite to the underlying surface, with the coverage factor of particles of the transparent insulating fine particles in the antireflection layer being made greater than the coverage factor of particles of the transparent insulating fine particles in the underlying layer. Since the coverage factor of particles of the transparent insulating fine particles in the antireflection layer is made greater than the coverage factor of particles of those in the underlying layer, reflection of light that is made incident on the antireflection layer is lowered so that the quantity of light to enter the photoelectric conversion layer is made greater; thus, the Jsc of the photoelectric conversion device is improved and the characteristics of the thin-film photoelectric conversion device can be consequently improved. In particular, the coverage factor of particles of the transparent insulating fine particles of the antireflection layer is desirably 80% or more.

Moreover, by using the step for simultaneously forming the underlying layer and the antireflection layer by a dipping method after the step for washing the transparent base member in the substrate for a thin-film photoelectric conversion device, and more preferably, by using a manufacturing method in which washing conditions for the underlying surface of the transparent base member are made different from washing conditions for the antireflection surface of the transparent base member, it becomes possible to make the coverage factor of particles of the antireflection layer greater than the coverage factor of particles of the underlying layer. More specifically, for example, the underlying surface is rinsed with pure water, and only the antireflection surface is subjected to a Cerico washing process by using a polishing buff impregnated with, for example, cerium oxide particles, or the pressing pressure of the polishing buff for the Cerico washing process is preferably made greater upon washing the antireflection surface in comparison with that of the polishing buff used upon washing the underlying surface. In this case, the term "washing" as used herein includes not only a method utilizing the above-mentioned liquid or solid substance, but also a method for modifying the surface state by utilizing a gas or its plasma.

In the above-mentioned substrate for a thin-film photoelectric conversion device, it is preferable to use a manufacturing method in which the underlying layer and the antireflection layer are formed by a printing method, with printing conditions used upon printing the underlying layer and printing conditions used upon printing the antireflection layer being made different from each other. In particular, the weight percentage of the transparent insulating fine particles in the coating solution is preferably made greater upon printing the antireflection layer than the weight percentage thereof upon printing the underlying layer.

EFFECTS OF THE INVENTION

In accordance with the present invention, the transparent insulating fine particles in the underlying layer are dispersed so as to cover one main surface of the transparent base member at a coverage factor in a range from 30% or more to 80% or less so that the fill factor (FF) and photoelectric conversion efficiency (Eff) of a thin-film photoelectric conversion device to be formed on the underlying layer can be improved. That is, by setting the coverage factor of fine particles to less than 80%, it is possible to suppress the particles from being partially stacked in severalfold, and by setting the coverage factor thereof to 30% or more, it is possible to form a zinc oxide transparent electrode layer with surface unevenness that is effectively used for exerting a light confinement characteristic, and also to improve the adhesion of the electrode layer. Moreover, when the insulating particles are suppressed from being partially stacked in severalfold, it is possible to suppress an insufficient laser scribing process upon manufacturing an integrated-type thin-film photoelectric conversion device, and consequently to improve the FF and Eff of the integrated-type thin-film photoelectric conversion device.

Furthermore, by setting the average particle size of the transparent insulating fine particles in the underlying layer in a range from 50 nm to 200 nm, it is possible to easily set the coverage factor of the particles in a range from 30% to 80%. In the case where the zinc oxide transparent electrode layer is deposited by using a low-pressure CVD method, a ZnO layer having preferable surface unevenness can be easily formed on the underlying layer containing fine particles, at a high film-forming rate.

In contrast, by making the coverage factor of particles of the antireflection layer greater than that of the underlying layer, preferably, by setting the coverage factor of particles of the antireflection layer to 80% or more, the reflectance of light to be made incident on the antireflection layer can be reduced so that the Jsc is increased and the characteristics of the thin-film photoelectric conversion device can be further improved.

EMBODIMENTS OF THE INVENTION

Figure 1:
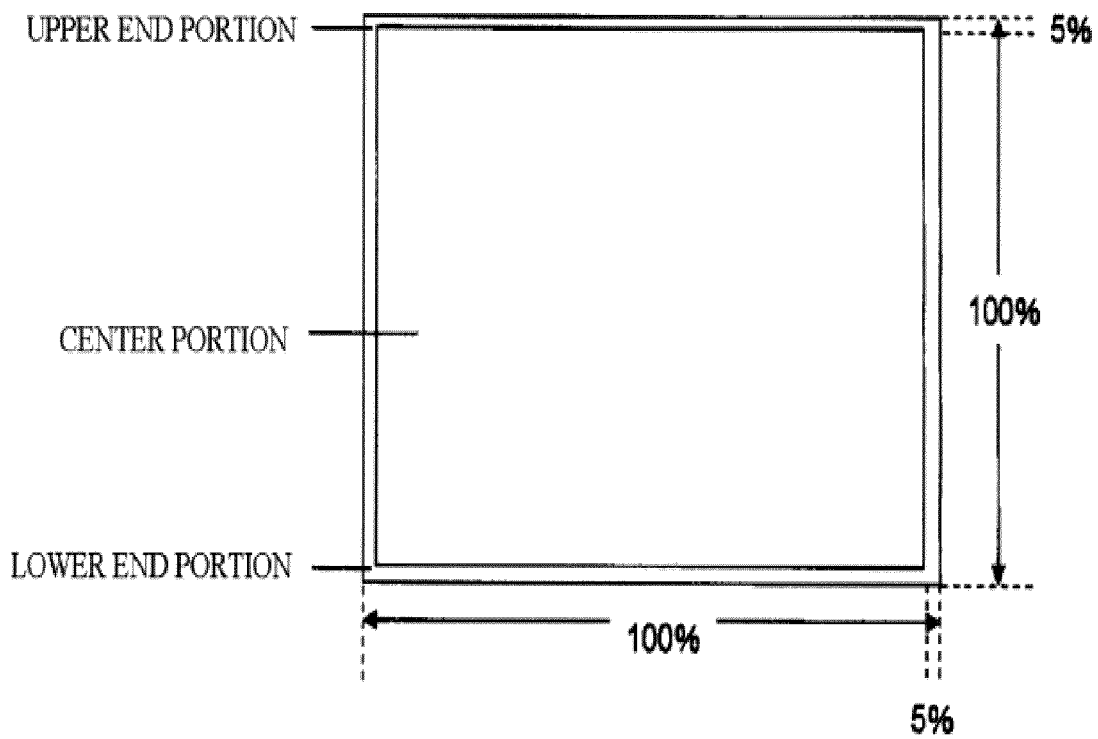
FIG. 1 is a schematic view showing a center portion and end portions of a main surface of a transparent base member.

The inventors have found that, as a result of study, in the case where a coverage factor of particles of an underlying layer is too high, a fill factor (FF) and an open circuit voltage (Voc) of a thin-film photoelectric conversion device including a ZnO transparent electrode layer deposited on the underlying layer not by a sputtering method, but by a low-pressure CVD method, are lowered to cause degradation of the conversion efficiency (Eff).

Although the reason for this is not necessarily clarified, it presumably relates to the fact that the ZnO layer deposited thereon by the sputtering method and the ZnO layer deposited thereon by the low-pressure CVD method have mutually different film characteristics. That is, in general, a film deposited by the sputtering method tends to have an upper surface on which fine surface unevenness of the underlying layer is alleviated, while a film deposited by the low-pressure CVD method tends to have an upper surface on which fine surface unevenness of the underlying layer is increased.

Moreover, in the case where the coverage factor of particles of the underlying layer is too high, it becomes difficult to maintain the distribution of fine particles as a single layer, with the result that fine particles are partially stacked in severalfold to form comparatively large, sharp convex portions. When a ZnO transparent electrode layer is deposited on the underlying layer having such large surface unevenness by the low-pressure CVD method, the resulting transparent electrode layer also has relatively large surface unevenness, and in the case where a semiconductor layer is superimposed thereon by a plasma enhanced CVD method, the coverage of the semiconductor layer on the transparent electrode layer may become insufficient. For example, there is a possibility that on the bottom of the deep concave portion of the large surface unevenness, the coverage of the semiconductor layer may become insufficient. On the other hand, on the sharp tip end of the convex portion of the rough surface unevenness, covering by the semiconductor layer may become insufficient to locally cause a short circuit between the transparent electrode layer and a back electrode.

Moreover, in the case where the coverage factor of particles of the underlying layer is too high, an integrated-type thin-film photoelectric conversion device, which has a structure in which a plurality of cells separated by laser scribing are serially-connected to one another, tends to have insufficient laser scribing to cause degradation of the fill factor (FF) and the open circuit voltage (Voc), and the subsequent degradation of the conversion efficiency (Eff).

In contrast, in the case where the coverage factor of particles of the underlying layer is too low, the surface unevenness of the ZnO transparent electrode layer becomes smaller to cause a reduction in a light confinement effect, with the result that the short circuit current density (Jsc) of the thin-film photoelectric conversion device is lowered to cause a reduction in the conversion efficiency (Eff). Moreover, in the case where the coverage factor of particles of the underlying layer is too low, the adhesion of the ZnO transparent electrode layer is lowered to cause a problem that the layer is easily lifted-off. In particular, in the integrated-type thin-film photoelectric conversion device, the lift-off of the transparent electrode layer tends to occur easily, with a separation groove formed by the laser scribing acting as a starting point.

Based upon the above detailed studies by the inventors, preferred embodiments of the present invention will be described with reference to the drawings. In the drawings of the present application, dimensions such as thickness and width are changed on demand for clarifying and simplifying the drawings, so that the actual dimensional relationships are not shown. Moreover, in the drawings of the present application, the same reference numerals represent the same portions or the corresponding portions.

Basically, in the thin-film photoelectric conversion device, it is important to increase a light confinement effect by increasing the surface unevenness of the transparent electrode layer so as to improve a photoelectric conversion characteristic. That is, it has been considered that, in general, in the case where fine particles are filled in the underlying layer as tightly as possible, the light confinement effect becomes greater to make the characteristic of the thin-film photoelectric conversion device higher. However, by the study of the inventors, it has been found that, contrary to expectations, there is a condition in which, when a certain degree of a gap is provided between the fine particles in the underlying layer, the characteristic of the thin-film photoelectric conversion device becomes higher. More specifically, in the case where, upon setting the coverage factor of particles of the underlying layer to less than 80%, and a ZnO transparent electrode layer is deposited on the underlying layer by the low-pressure CVD method, the characteristic of the thin-film photoelectric conversion device becomes higher.

Moreover, it had been considered that in order to obtain a proper adhesion between an insulating base member and the transparent electrode layer having surface unevenness that is sufficient for exerting a light confinement, the coverage factor of particles of the underlying layer needs to be increased (80% or more of the coverage factor of particles, for example, in Patent Document 1). However, the inventors have found that, even when the coverage factor of particles of the underlying layer is considerably low, appropriate surface unevenness and adhesion of a ZnO transparent electrode layer deposited by a low-pressure CVD method can be achieved. More specifically, in the case where the coverage factor of particles of the underlying layer is 30% or more, it is possible to deposit a ZnO transparent electrode layer having surface unevenness that is sufficient for exerting a light confinement characteristic, and an appropriate adhesion, by using a low-pressure CVD method.

Figure 10:
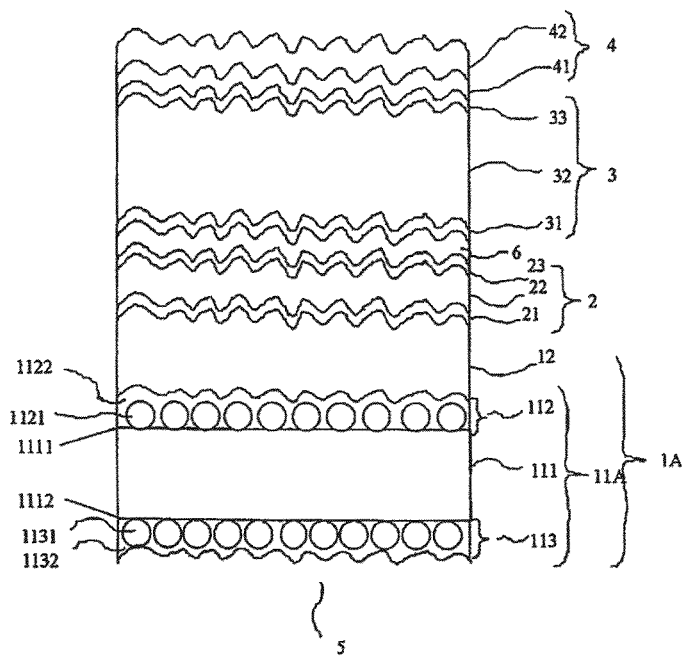
FIG. 10 is a schematic cross-sectional view showing a substrate for thin-film photoelectric conversion device having an antireflection layer and a thin-film photoelectric conversion device including the same in accordance with one embodiment of the present invention.

FIG. 10 is a schematic cross-sectional view showing a substrate for a thin-film photoelectric conversion device and a thin-film photoelectric conversion device including such a substrate in accordance with one embodiment of the present invention. In this figure, a substrate 1A for a thin-film photoelectric conversion device includes a transparent electrode layer 12 deposited on a transparent insulating base member 11A, and on the substrate 1A, a front photoelectric conversion unit 2, an intermediate transmissive-reflective layer 6, a rear photoelectric conversion unit 3, and a back electrode layer 4 are stacked in this order so that a thin-film photoelectric conversion device 5 is formed.

The transparent insulating base member 11A includes a transparent base member 111 and a transparent underlying layer 112 placed thereon and a transparent antireflection layer 113 placed underneath. As the transparent base member 111, a glass plate, a plate-like member or a sheet-like member made of a transparent resin, or the like, is mainly used. In particular, the use of a glass plate as the transparent base member 111 is preferable because it has high transmittance and is inexpensive.

That is, since the transparent insulating base member 11A is positioned on the light incident side of the thin-film photoelectric conversion device 5, it is preferable to make the transparent insulating base member 11A as transparent as possible so as to allow solar light to transmit therethrough as much as possible so as to be absorbed by the photoelectric conversion units 2 and 3. From the same viewpoint, it is preferable to provide the antireflection layer 113 on the light incident surface of the transparent insulating base member 11A so as to reduce light reflection losses on the incident surface of solar light.

The transparent underlying layer 112 and the transparent antireflection layer 113 may be formed by applying transparent fine particles 1121 and 1131 onto the transparent base member 111 together with, for example, a binder forming material containing a solvent. More specifically, as the transparent binders 1122 and 1132, metal oxides, such as a silicon oxide, an aluminum oxide, a titanium oxide, a zirconium oxide and a tantalum oxide, may be utilized. Moreover, as the transparent fine particles 1121 and 1131, materials, such as silica ($SiO_2$), titanium oxide ($TiO_2$), aluminum oxide ($Al_2O_3$), zirconium oxide ($ZrO_2$), indium tin oxide (ITO), or magnesium fluoride ($MgF_2$), may be used.

One preferred aspect of the present invention is characterized in that the material for the transparent insulating fine particles contained in the antireflection layer and the material for the transparent insulating fine particles contained in the underlying layer are prepared as the same material. When the same material is used as the material for the transparent insulating fine particles contained in the antireflection layer and the material for the transparent insulating fine particles contained in the underlying layer, it is preferable because the two surfaces can be simultaneously coated with the material in a single process. Requirement for larger area, for example the transparent substrate with size of, such as 910 mm×455 mm, 1 m square (1000 mm×1000 mm) or more, 1.2 m square (1200 mm×1200 mm) or more, 1000 mm×1300 mm, 1000 mm×1400 mm, and 1.4 m square (1400 mm×1400 mm), is increasing, so that transparent insulating particles and the like need to be applied to transparent base members having such large areas. Therefore, the simultaneous applying processes, such as simultaneous applying processes onto the two surfaces, are greatly advantageous in that the number of processes such as handling or the like of the large-size transparent base members can be reduced, and are preferable.

As the method for applying a coating solution to the transparent base member 111, methods, such as a dipping method, a spin coating method, a bar-coating method, a spraying method, a die coating method, a roll coating method (printing method) and a flow coating method, may be used. In order to uniformly and densely form transparent fine particles, the dipping method or the roll coating method is preferably used. Upon completion of the application of the coating solution, the coating solution is immediately heated and dried. In order to uniformly form fine surface unevenness on the transparent underlying layer 112 as well as on the transparent antireflection layer 113, the shapes of the transparent fine particles 1121 and 1131 are preferably set to spherical shapes.

The coverage factor of particles of the transparent underlying layer 112 is set within a range from 30% to 80%. That is, by setting the coverage factor of particles to 80% or less, it is possible to suppress the transparent fine particles 1121 from stacking on specific areas in severalfold, and consequently to improve the FF and Eff of the thin-film photoelectric conversion device 5, and in the case of an integrated-type thin-film photoelectric conversion device, it is possible to suppress an insufficient laser scribing process and consequently to improve the FF and Eff thereof. On the other hand, by setting the coverage factor of particles to 30% or more, it is possible to form a transparent electrode layer 12 having surface unevenness that is effectively used for confining light, and consequently to improve the adhesion of the transparent electrode layer. As will be shown by experimental examples and examples of the present invention to be described later, by setting the coverage factor of particles to 44% or more to 77% or less, a more preferable structure can be provided because the conversion efficiency of the integrated-type hybrid module is allowed to have a high value of 12.5% or more.

The influences of the average particle size of the transparent fine particles 1121 was studied through experiments, and it was found that as the average particle size becomes smaller, the coverage factor of particles tends to easily become higher, and that as the average particle size becomes larger, the coverage factor of particles tends to easily become lower. In order to set the coverage factor of particles in a range from 30% or more to less than 80%, the average particle size calculated by a dynamic light scattering method or image analysis is preferably set in a range from 50 nm to 200 nm, more preferably, from 80 nm to 120 nm.

The coverage factor of particles of the transparent underlying layer 112 can be controlled by adjusting the mass ratios of the transparent fine particles, the binder and the solvent in the coating solution. In addition, the coverage factor of particles can also be controlled by adjusting factors at the time of the application of the coating solution, such as the temperature, moisture, applying rate, the number of applications and heating and drying conditions. The mass concentration of the fine particles relative to the entire coating solution is preferably set in a range from 0.1% to 10%, more preferably, in a range from 1 to 6%.

The coverage factor of particles can be measured by using a scanning microscope, such as an atomic force microscope (AFM) or a scanning tunnel microscope (STM), or a scanning electron microscope (SEM). For example, the coverage factor of particles can be obtained through the following sequence of processes by utilizing the AFM. That is, an AFM image of the surface of an underlying layer containing fine particles is obtained so that three-dimensional data corresponding to the height distribution of the surface is found. A histogram is formed with respect to the surface height, and the surface height having the highest frequency is defined as an average grain size (d). With respect to the AFM image capable of indicating the three-dimensional information of the surface, the rate of areas having a value of d/2 or more (corresponding to areas coated with particles of at least one particle layer, including areas coated with stacked layers of two or more particles) is found to indicate the coverage factor of particles. In the present invention, in the AFM measurements, a Nano-R system (manufactured by Pacific Nanotechnology Co., Ltd.) in a non-contact mode was used.

In the present invention, a surface that is in contact with the transparent underlying layer 112 forming one main surface of the transparent base member 111 is referred to as an underlying surface, and the other main surface of the transparent base member on the side opposite to the underlying surface is referred to as an antireflection surface. It is preferable to provide an antireflection layer 113 including transparent insulating fine particles and a transparent binder so as to be brought in contact with the antireflection surface of the transparent base member, and the coverage factor of particles of the antireflection layer is preferably made higher than the coverage factor of particles of the underlying layer. In particular, the coverage factor of particles is preferably set to 80% or more. That is, the antireflection layer is densely filled with insulating fine particles so as to make its reflectance lower. In the same manner as in the underlying layer, the antireflection layer is manufactured by using methods, such as a dipping method, a spin coating method, a bar-coating method, a spraying method, a die coating method, a roll coating method, and a flow coating method. In particular, the dipping method is preferably used because this method makes it possible to simultaneously form the underlying layer and the antireflection layer.

Figure 2:
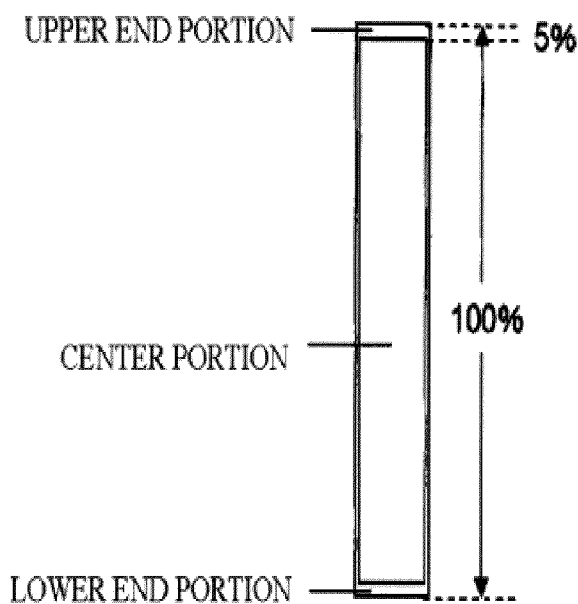
FIG. 2 is a schematic view showing a center portion and end portions of a side surface of the transparent base member.

The dipping method is a method in which, after the transparent base member has been immersed into a solution, the transparent base member is pulled out so as to form a film thereon; therefore, after the transparent base member has been pulled out, a film-forming component is inevitably deposited not only on the underlying surface and the antireflection surface that form main surfaces of the transparent base member, but also on its "side surfaces", "lower surface" and the like. In this case, the "side surfaces" of the transparent base member are portions shown in FIG. 2, which correspond to surfaces that are vertically connected to the underlying surface and the antireflection surface in lateral directions, and the "lower surface" represents a surface that is vertically connected downward to the underlying surface and the antireflection surface. Generally, for example, the coverage factor of particles on the side surfaces would be 10% or more and less than 99.5%, and the coverage factor of particles on the lower surface would be 10% or more and 100% or less.

Moreover, in the dipping method, when an attempt is made so as to avoid the base member supporting portion from being immersed in the solution, one portion of the base member (for example, a base-member grabbing portion) is not immersed therein. In this case, inevitably, no film is formed on the corresponding portion, with the result that a film-formed portion and a non-film-formed portion are generated in one base member. More specifically, for example, when an end portion of the base member main surface is grabbed, no transparent insulating fine particles are contained in the end portion of the main surface of the grabbed portion, and no transparent insulating fine particles are contained in the side surface end portions as well. In this case, the end portion of the main surface, described herein, corresponds to a portion shown in FIG. 1, and represents end portion areas of the underlying surface and the antireflection surface. In addition, although the end portion is not necessarily defined in its range clearly in its nature, the portion means an area within 5% or less from the outermost portion, preferably, within 1% or less, more preferably, within 0.5% or less, therefrom, supposing that the entire main surface is defined as 100%. Furthermore, the side surface end portions mean the same end portions on the side surfaces, and these are sometimes collectively referred to as "end portions".

In the dipping method, since, upon pulling out the transparent base member, the film-forming solution tends to inevitably stay on the base member lower portion due to influences of gravity, the film on the lower end portion tends to be made thicker locally. More specifically, upon pulling out the transparent base member by grabbing the upper end portion of the main surface so as to avoid the base member grabbing portion from being immersed in the solution, "the end portion of the main surface on the side opposite to the end portion of the main surface which contains no transparent insulating fine particles" tends to have transparent insulating fine particles stacked as multiple layers in comparison with those on the center portion of the main surface. For example, supposing that the end portion of the main surface (base member grabbing portion) containing no transparent insulating fine particles corresponds to the upper end portion in FIG. 1, the end portion of the main surface on the side opposite to the end portion of the main surface corresponds to the lower end portion shown in FIG. 1. Moreover, the center portion of the main surface means an area on the main surface from which the end portion is excluded, and preferably corresponds to an area of 99 to 90% based upon the center of the main surface serving as a reference.

In the dipping method, it is preferable to wash a transparent base member before the underlying layer and/or the antireflection layer are formed thereon. In the case where a glass substrate is used as the transparent base member, it is preferable to wash the glass substrate prior to the formation of the underlying layer and/or the antireflection layer so that an adhesive carbon component and burned spot on the glass substrate surface are removed. The washing methods for the glass substrate include an ultrasonic washing process, a plasma washing process, an alkali washing process, a Cerico washing process and the like. In order to remove the burned spot that corresponds to a denatured component on the glass substrate surface that has been chemically changed, a chemical removing process or a physical removing process, such as polishing, is preferably carried out. Therefore, among the above-mentioned washing methods, the plasma washing method, the alkali washing method and the Cerico washing process are preferably selected. In the case of the plasma washing process, although the carbon component and the burned spot on the glass substrate surface can be removed by using carbon tetrafluoride plasma, glass components, such as Mg, Na, Ca and Al, are left on the glass substrate surface. In the case of the alkali washing process, a film (barrier) of sodium silicate is formed on the glass surface, and since alkali reacts through the barrier, the surface is formed into a porous state. In the case of the Cerico washing method, there are caused no problems such as residual foreign matters on the glass substrate surface and changes in the surface shape, and the controlling process of the washing is easily carried out. Therefore, among the washing methods, the Cerico washing method is preferably selected; however, any washing method may be selected as long as the carbon element concentration on the glass substrate surface after the washing process is set to 9.5% or less.

Here, the Cerico washing will be described. The Cerico washing is a general method for polishing and washing the glass. The "Cerico washing" refers to a method for carrying out polishing and washing processes by using a polishing slurry mainly composed of water and cerium oxide, and in its mechanism, cerium oxide and water are allowed to approach silicon oxide on a glass surface by the function of compressive stress to form $Si(OH)_4$ through a chemical reaction so as to be eluted into the solution. In the washing method, the polishing slurry composed of water and cerium oxide is put on a cloth or sponge, and the glass is rubbed with this so that the Cerico washing is preferably carried out. More preferably, a polishing buff secured onto a sponge made of, for example, polyvinyl alcohol is allowed to absorb water, and the washing process is carried out, with cerium oxide particles being pressed onto the glass surface by the polishing buff. After the Cerico washing, the resulting glass is preferably rinsed with pure water and washed.

A method for increasing the coverage factor of particles on the antireflection layer so as to be greater than that of particles on the underlying layer by using a dipping method is achieved by making the conditions of the washing process of the underlying surface of the transparent base member and the conditions of the washing process of the antireflection surface of the transparent base member different from each other. More specifically, only the antireflection surface is washed by using the Cerico washing process, and thereafter, the antireflection surface and the underlying surface are preferably rinsed with pure water and washed. Alternatively, both of the underlying surface and the antireflection surface are washed by using the Cerico washing process, and the washing processes are preferably carried out, with the pressing pressure onto the antireflection surface at the time of washing the antireflection surface being made greater in comparison with the pressing pressure onto the underlying surface at the time of washing the underlying surface. More specifically, both of the underlying surface and antireflection surface are subjected to the Cerico washing process by using a polishing buff impregnated with cerium oxide particles, and the pressing pressure of the polishing buff at the time of the Cerico washing process of the antireflection surface is preferably made greater than that of the polishing buff at the time of the Cerico washing process of the underlying surface. In addition, the same method can be achieved by increasing the number of polishing revolutions or the number of revolutions of the polishing buff at the time of the Cerico washing process of the antireflection surface than that at the time of the Cerico washing process of the underlying surface. Alternatively, a period of time from the completion of the Cerico washing process to the start of the dipping process is made shorter at the time of forming the antireflection layer than that at the time of forming the underlying layer; thus, the same effect can be achieved. With respect to the pressing pressure of the polishing buff, if is preferably set to 2 to 10 kgf at the time of the Cerico washing process of the antireflection surface, while it is preferably set to 0.5 to 2 kgf at the time of the Cerico washing process of the underlying surface.

Moreover, in the case where the printing method is used for forming the underlying layer and the antireflection layer, a method for increasing the coverage factor of particles on the antireflection layer so as to be greater than that of particles on the underlying layer is prepared by making a weight percentage of insulating fine particles of the coating solution of the printing conditions of the antireflection layer greater than that of the printing conditions of the underlying layer. In this case, by bringing two printing rollers in contact with the underlying surface and the antireflection surface, the transparent underlying layer and the antireflection layer may be simultaneously formed. In addition, the same method can be achieved by increasing the number of printing processes of the printing conditions of the antireflection layer in comparison with that of the printing conditions of the underlying layer, or by increasing the number of rollers through which the antireflection surface passes in comparison with that of the underlying layer.

In the case where float glass is used for the transparent base member, a surface having less content of tin is preferably used as the underlying surface, and a surface having more content of tin is preferably used as the antireflection surface. The reason for this is because, in the case where after the Cerico washing process has been carried out by applying the same degree of pressure to the float glass, and a dipping method is applied thereto, the surface having less content of tin tends to have a smaller coverage factor of transparent fine particles in comparison with the surface having more content of tin so that the resulting surface provides a surface that is more suitable for the underlying surface.

As the material for the transparent electrode layer 12 on the transparent insulating base member 11, ZnO is utilized. As its doping impurities, at least one kind selected from the group consisting of B, Al and Ga is preferably contained therein, and in particular, it is preferable to contain B atoms at a concentration of $2 \times 10^{19}$ atoms/cm$^3$ or more. Moreover, in addition to the doping impurities, it is also preferable to contain H atoms at a concentration of $2 \times 10^{20}$ atoms/cm$^3$ or more. In the ZnO layer containing H, since surface unevenness capable of generating a light confinement effect is easily formed, it is desirably used as a transparent electrode layer for the thin-film photoelectric conversion device.

A ZnO transparent electrode layer 12 of a substrate 1 for a thin-film photoelectric conversion device can be formed by a low-pressure thermal CVD method at a deposition temperature of 200° C. or less. The deposition temperature of the transparent electrode layer 12 refers to a temperature of the surface of the base member 11 that is in contact with the heating unit of the CVD device.

In the deposition of the ZnO transparent electrode layer 12, diethyl zinc (also referred to as DEZ) or dimethyl zinc, serving as organic metal vapor, water serving as oxidant vapor, and $B_2H_5$ serving as a doping gas, are used, with at least one kind selected from the group consisting of $H_2$, He and Ar being added thereto as a diluting gas, and a mixed gas thus prepared is preferably directed to a reduced-pressure vessel under a pressure of 5 to 200 Pa. The deposition temperature is preferably set to 200° C. or less, more preferably, in a range from 140° C. to 170° C. The flow rate of DEZ may be set to 10 to 1000 sccm, the flow rate of water may be set to 10 to 1000 sccm, the flow rate of $H_2$ may be set to 100 to 10000 sccm, and the flow rate of Ar may be set to 100 to 10000 sccm, respectively. The concentration of $B_2H_6$ is preferably set to 0.1% to 10% relative to DEZ.

As the transparent electrode layer (ZnO layer) 12 to be deposited, a thin-film having a crystalline grain size in a range of substantially 50 to 500 nm, with surface unevenness having a highest-to-lowest height difference in a range of substantially 20 to 200 nm, is preferably used from the viewpoint of obtaining an appropriate light confinement effect of the thin-film photoelectric conversion device. Moreover, the haze ratio of the substrate 1 including the ZnO layer 12 is preferably set to 15% or more, and more preferably, to 20% or more from the viewpoint of obtaining the light confinement effect of the thin-film photoelectric conversion device.

The sheet resistance of the ZnO layer 12 is preferably set to 15 Ω/square or less, more preferably, to 10 Ω/square or less, from the view point of suppressing the resistance loss.

The average thickness of the ZnO layer 12 is preferably set to 0.7 to 5 μm, more preferably to 1 to 3 p.m. The reason for this is because, when the ZnO film is too thin, it becomes difficult to produce sufficient surface unevenness required for efficiently exerting the light confinement effect and to obtain conductivity required for the transparent electrode layer. On the other hand, in the case where the ZnO layer is too thick, the quantity of light to reach the photoelectric conversion unit is reduced due to light absorption of the film itself, causing degradation of the photoelectric conversion efficiency. Moreover, in the case where the ZnO film is too thick, the film-forming costs tend to increase due to an increase in film-forming time.

The surface area ratio (Sdr) of the deposited ZnO layer 12 is preferably in a range from 55% to 95%. When Sdr is too large, the open circuit voltage (Voc) and the fill factor (FF) are lowered to cause degradation of the conversion efficiency (Eff). Depending on cases, the short circuit current density (Jsc) is lowered to cause degradation of the conversion efficiency (Eff). The reason for the degradation of Voc and FF when Sdr is large is presumably because a level change in the surface unevenness of the substrate 1 becomes sharp, with the result that the coverage of the silicon semiconductor layer on the transparent electrode layer 12 becomes insufficient to cause an increase in the contact resistance or an increase in the leak current of the thin-film photoelectric conversion device. Moreover, the reason for the degradation of Jsc when Sdr is large is presumably because the growth of the semiconductor layer on the transparent conductive film 12 is blocked to cause degradation of the film quality of the semiconductor layer and subsequently more losses due to the carrier recombination in the semiconductor layer.

On the other hand, in the case where Sdr is too small, since the surface unevenness of the substrate 1 becomes smaller, the light confinement effect becomes weaker to cause degradation of Jsc and the subsequent degradation of Eff. The surface area ratio of the ZnO layer 12 can be adjusted to an appropriate value by controlling the film-forming conditions. For example, in a low-pressure thermal CVD method, since the surface area ratio of the ZnO layer is remarkably varied depending on the film-forming conditions, such as the deposition temperature, the flow rates of material gases and the pressure, the surface area ratio can be adjusted to a desired value by controlling these conditions.

In the case where an amorphous silicon-based material is selected for the front photoelectric conversion unit 2, it shows a sensitivity to light rays having wavelengths of about 360 to 800 nm. On the other hand, in the case where a crystalline silicon-based material is selected for the rear photoelectric conversion unit 3, it shows a sensitivity to light rays having longer wavelengths up to about 1200 nm. Therefore, in the case of the hybrid-type thin-film photoelectric conversion device 5 in which the front photoelectric conversion unit 2 made of the amorphous silicon-based material and the rear photoelectric conversion unit 3 made of the crystalline silicon-based material are stacked in this order from the light incident side, it becomes possible to effectively utilize incident light rays within a wider wavelength range. In this case, the "silicon-based materials" include not only silicon but also silicon alloy semiconductor materials such as silicon carbide and silicon germanium.

In order to improve the conversion efficiency of the stacked-type thin-film photoelectric conversion device, there is proposed a method in which an intermediate transmissive-reflective layer 6, made of a material having a conductive property and a refractive index lower than that of the material forming the photoelectric conversion units 2 and 3, is formed between the thin-film photoelectric conversion units 2 and 3. Such an intermediate transmissive-reflective layer 6 can be designed so as to reflect light rays with shorter-wavelength, while allowing light rays with longer-wavelength side to transmit therethrough, so that the respective thin-film photoelectric conversion units 2 and 3 can more effectively carry out the photoelectric conversion process.

In the case where the intermediate transmissive-reflective layer 6 is inserted between the front amorphous silicon photoelectric conversion unit 2 and the rear crystalline silicon photoelectric conversion unit 3, it is possible to increase a current generated by the front unit 2, without the necessity of increasing a film thickness of an amorphous silicon photoelectric conversion layer 22. Moreover, in the case where the intermediate transmissive-reflective layer 6 is included, since the thickness of the amorphous silicon photoelectric conversion layer 22 required for obtaining the same current value can be made smaller in comparison with the structure without the intermediate transmissive-reflective layer 6, it is possible to suppress a reduction in the characteristic of the amorphous silicon photoelectric conversion unit 2 due to photodegradation (Staebler-Wronsky effect) that becomes conspicuous in response to an increase in thickness of the amorphous silicon layer.

Although the intermediate transmissive-reflective layer may be inserted between the front photoelectric conversion unit and the rear photoelectric conversion unit, it may also be formed as one portion of the rear conductive layer in the front photoelectric conversion unit, or may also be formed as one portion of the front conductive layer in the rear photoelectric conversion unit.

The front photoelectric conversion unit 2 is formed by depositing, for example, a p-layer, an i-layer and an n-layer in this order by a plasma enhanced CVD method. More specifically, a p-type amorphous silicon carbide layer 21 doped with 0.01 atomic % or more of boron, a photoelectric conversion layer 22 made of substantially i-type amorphous silicon, and an n-type microcrystalline silicon layer 23 doped with 0.01 atomic % or more of phosphorous are deposited in this order.

As the material for the intermediate transmissive-reflective layer 6, a conductive metal oxide such as zinc oxide or ITO may be used, and a silicon-based composite material containing microcrystalline silicon and silicon oxide that can be formed by a plasma enhanced CVD method in the same manner as in the amorphous silicon layer and the crystalline silicon layer may be used. In the case of the integrated-type module, the use of the conductive oxide as the intermediate transmissive-reflective layer 6 may cause a problem of a short-circuit in the rear photoelectric conversion unit; however, the use of the silicon-based composite material having a comparatively high resistance makes it possible to avoid this problem, and is preferably employed. The silicon-based composite layer is preferably formed by using a plasma enhanced CVD method in which, for example, $SiH_4$, $CO_2H_2$ and $PH_3$ are used as reaction gases, with a large $H_2/SiH_4$ ratio that is a so-called microcrystalline silicon forming condition being set, and a $CO_2/SiH_4$ ratio relating to silicon oxide is set to 2 or more. In this plasma enhanced CVD method, for example, by using capacity-coupled-type parallel flat electrodes, the processes are preferably carried out under conditions of a power-supply frequency in a range from 10 to 100 MHz, a high-frequency power density of 0.01 to 0.5 W/cm$^2$, a pressure in a range from 50 to 1500 Pa and a deposition temperature in a range from 150 to 250° C. When the $CO_2/SiH_4$ ratio is increased, the oxygen concentration in the film monotonically increases, thereby making it possible to lower the refractive index of the intermediate transmissive-reflective layer 6.

The rear photoelectric conversion unit 3 is also formed by depositing, for example, a p-layer, an i-layer and an n-layer in this order by the plasma enhanced CVD method. More specifically, a p-type microcrystalline silicon layer 31 doped with 0.01 atomic % or more of boron, a photoelectric conversion layer 32 made of substantially i-type crystalline silicon, and an n-type microcrystalline silicon layer doped with 0.01 atomic % or more of phosphorous are deposited in this order.

As the back electrode layer 4, at least one kind of material, selected from the group consisting of Al, Ag, Au, Cu, Pt and Cr, is preferably deposited as at least one metal layer 42 by using a sputtering method or a vapor deposition method. Moreover, a conductive oxide layer 41 such as ITO, $SnO_2$ or ZnO is preferably formed as one portion of the back electrode layer 4, between the metal layer 42 and the photoelectric conversion unit 3 adjacent thereto. The conductive oxide layer 41 enhances the adhesion between the back electrode layer 4 and the photoelectric conversion unit 3 adjacent thereto, while increasing the light reflectance of the back electrode layer 4, and further has a function for preventing chemical changes of the photoelectric conversion units 3 and 2.

As shown in FIG. 10, the thin-film photoelectric conversion device may include a stack of two photoelectric conversion units; however, needless to say, it may have a single cell structure including only one photoelectric conversion unit, or a so-called triple cell structure including a stack of three photoelectric conversion units, or a multiple cell structure including four or more photoelectric conversion units. For example, the thin-film photoelectric conversion device may have an amorphous single cell structure in which only the amorphous silicon photoelectric conversion unit corresponding to the front photoelectric conversion unit 2 of FIG. 10 is formed, with the intermediate transmissive-reflective layer 6 and the rear photoelectric conversion unit 3 being omitted. Moreover, ZnO is used in the transparent electrode layer 12 of the present invention, and since ZnO has a higher plasma resistant characteristic in comparison with $SnO_2$, a crystalline silicon photoelectric conversion unit can be directly formed on the transparent electrode layer 2. That is, in the present invention, a crystalline single cell, which includes only the crystalline silicon photoelectric conversion unit 3 in FIG. 10, with the front photoelectric conversion unit 2 and the intermediate transmissive-reflective layer 6 being omitted, may also be used. Moreover, as one example of the triple cell structure, three photoelectric conversion units such as an amorphous silicon photoelectric conversion unit/an amorphous silicon germanium photoelectric conversion unit including substantially an i-type amorphous silicon germanium layer/a crystalline silicon photoelectric conversion unit may be stacked in this order. Furthermore, three photoelectric conversion units such as an amorphous silicon photoelectric conversion unit/a crystalline silicon photoelectric conversion unit/a crystalline silicon photoelectric conversion unit may be stacked in this order.

Figure 11:
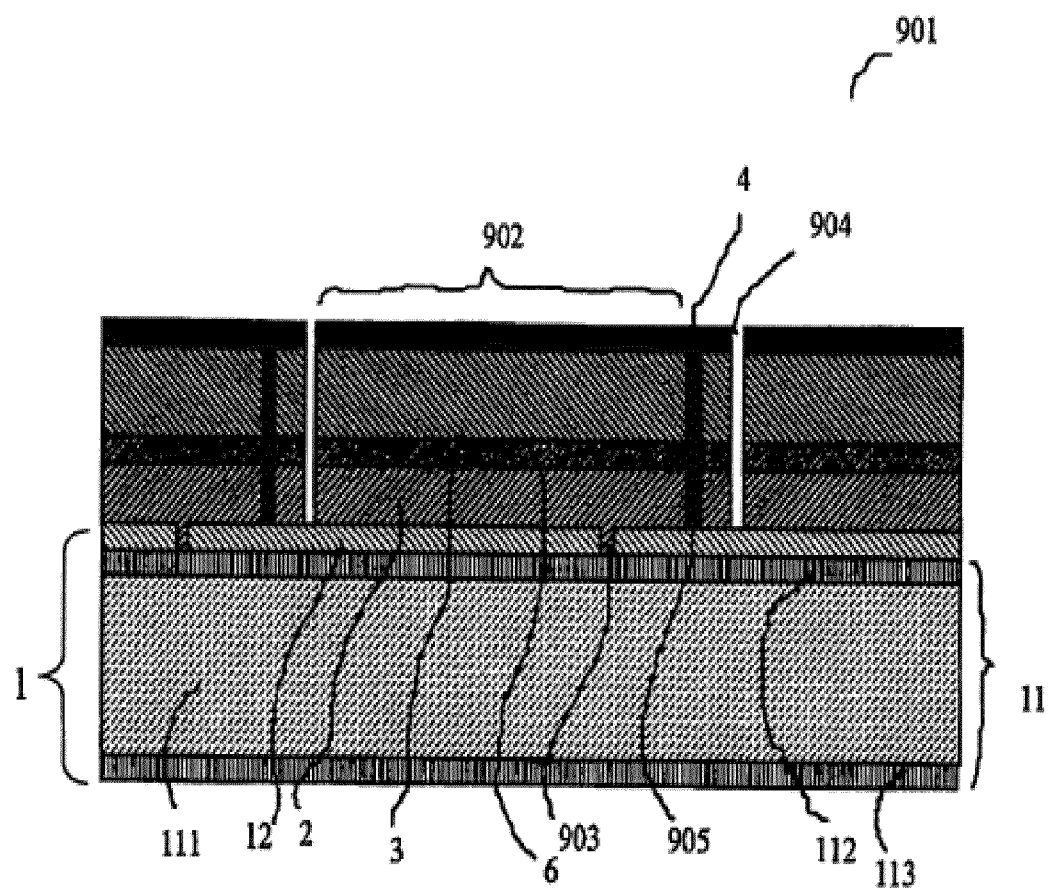
FIG. 11 is a schematic cross-sectional view showing an integrated-type thin-film photoelectric conversion module having an antireflection layer in accordance with another embodiment of the present invention.

FIG. 11 is a cross-sectional view schematically showing an integrated-type thin-film photoelectric conversion module in accordance with another embodiment of the present invention. In the integrated-type thin-film photoelectric conversion module 901, on a transparent insulating base member 11 including a glass plate 111, an underlying layer 112 and an antireflection layer 113, a transparent electrode layer 12, a front unit 2 serving as an amorphous silicon photoelectric unit, an intermediate transmissive-reflective layer 6, a rear unit 3 serving as a crystalline silicon photoelectric conversion unit, and a back electrode layer 4 are successively stacked in this order.

Moreover, in the integrated-type thin-film photoelectric conversion module 901 of FIG. 11, first and second separation grooves 903, 904, and a connection groove 905 are formed. The first and second separation grooves 903, 904 and the connection groove 905 are in parallel with each other, and extended in a direction perpendicular to the drawing surface of FIG. 11. Note that the boundary area between adjacent photoelectric conversion cells 902 is defined by the first and second separation grooves 903, 904 that are closely located thereto.

The first separation groove 903 divides the transparent electrode layer 12 in association with the respective photoelectric conversion cells 902. The second separation groove 904 divides the front photoelectric conversion unit 2, the intermediate transmissive-reflective layer 6, the rear photoelectric conversion unit 3 and the back electrode layer 4 in association with the respective photoelectric conversion cells 902. The connection groove 905 penetrates the front photoelectric conversion unit 2, the intermediate transmissive-reflective layer 6 and the rear photoelectric conversion unit 3, and is embedded with a metal material forming the back electrode layer 4 so that the back electrode layer 4 on one side and the transparent electrode layer 12 on the other side of the adjacent photoelectric conversion cells 902 are electrically connected with each other. That is, the connection groove 905 is formed so as to make the photoelectric conversion cells 902, placed side by side on the transparent insulating base member 11, serially-connected to one another.

EXAMPLES

Hereinafter, various experimental examples and examples of the present invention will be described in more detail, together with various reference examples and comparative examples. It is needless to say that the present invention is not limited to the following examples, and various changes may be made within the scope not departing from the gist of the invention.

Experimental Example 1

Figure 3:
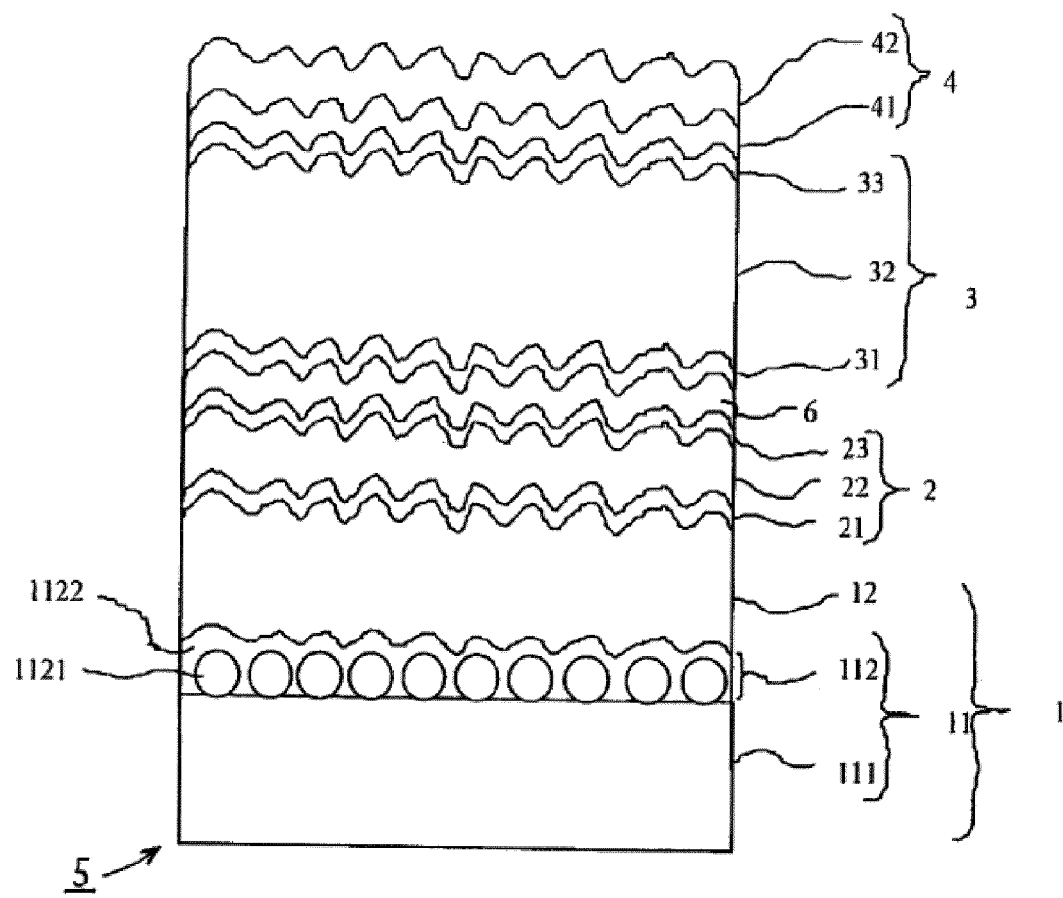
FIG. 3 is a schematic cross-sectional view showing a substrate for thin-film photoelectric conversion device and a thin-film photoelectric conversion device including the same.

A substrate 1 for a thin-film photoelectric conversion device, as shown in FIG. 3, was manufactured as Experimental Example 1 of the present invention. First, a transparent underlying layer 112 containing $SiO_2$ fine particles 1121 and a binder 1122 was formed on a glass plate 111 having a thickness of 4 mm and an area of 910 mm×455 mm so as to obtain a transparent insulating base member 11. A coating solution to be used upon forming the transparent underlying layer 112 was prepared by processes in which tetraethoxy silane was added to a mixed solution of a dispersion solution of spherical silica having an average particle size of 100 nm, water and ethylcellosolve, and thereafter hydrochloric acid was added so that tetraethoxy silane was hydrolyzed, and diacetone alcohol and propylene glycol were further added as diluting solutions. The mass concentration of spherical silica relative to the coating solution as a whole was 6%. After the coating solution had been applied onto the glass plate 111 by a printing machine, the coating solution was dried at 90° C. for 30 minutes, and then further heated at 450° C. for 5 minutes so as to obtain a transparent insulating base member 11 having fine surface unevenness.

Figure 5:
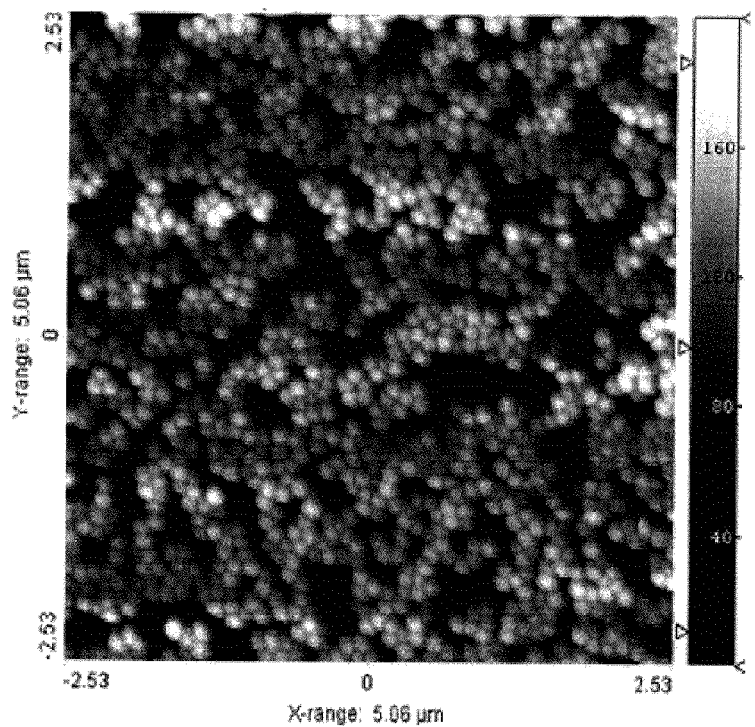
FIG. 5 is an AFM (Atomic Force Microscope) image showing a particle-covering state on a transparent insulating base member in Experimental Example 1 of the present invention.

FIG. 5 shows an atomic force microscopic (AFM) image of the upper surface of the resulting transparent insulating base member 11. One side of this square image corresponds to about 5 µm (5.06 µm), and a brightness scale shown on the right side thereof represents the surface height. That is, in the AFM image, as the point becomes higher in the brightness scale, it has a higher surface position. In FIG. 5, gaps were observed among the silica particles, and the coverage factor of particles, obtained by the aforementioned AFM measurement, was 76.7%.

Figure 6:
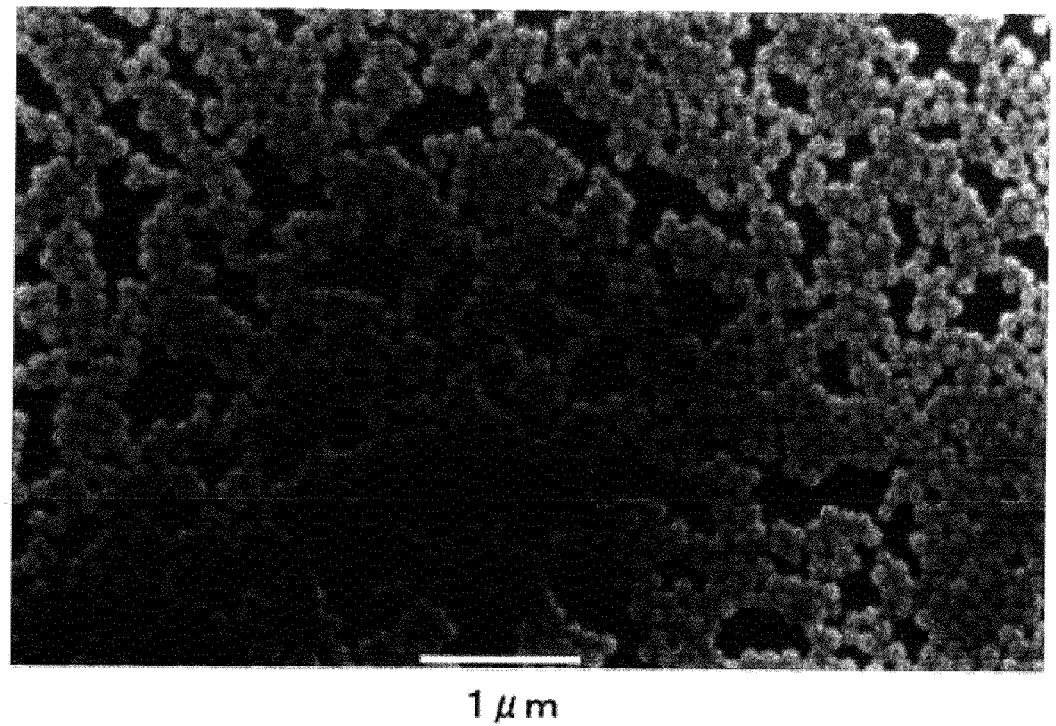
FIG. 6 is an SEM (Scanning Electronic Microscope) image showing a particle-covering state on the transparent insulating base member in Experimental Example 1.

FIG. 6 shows, as a reference, a scanning electron microscopic (SEM) image of the upper surface of the transparent insulating base member 11 obtained in Experimental Example 1. In the SEM image of FIG. 6 as well, the same particle distribution as that of the AFM image of FIG. 5 was observed. That is, as described earlier, it is understood that the corresponding coverage factor of particles can be obtained not only by the AFM measurements, but also by the SEM image.

On the transparent insulating base member 11, a transparent electrode layer 12 made of ZnO was formed by using a low-pressure CVD method. The transparent electrode layer 12 was formed under conditions of a deposition temperature of 160° C., a pressure of 30 Pa, a flow rate of diethyl zinc (DEZ) vapor of 200 sccm, a flow rate of water vapor of 700 sccm, a flow rate of diborane ($B_2H_6$) of 2 sccm and a flow rate of hydrogen of 1000 sccm.

In the resulting ZnO transparent electrode layer 12, the thickness, obtained from interference of reflection spectra, was 1.7 µm, the sheet resistance was 12.1 Ω/square, the haze ratio, measured by using an illuminant C, was 21.6%, and the surface area ratio (Sdr), obtained by the AFM measurements, was 75.5%. Moreover, the H concentration of the ZnO transparent electrode layer 12, measured by the secondary ion mass spectrometry (SIMS), had a distribution in a film-thickness direction, and was in a range from $9 \times 10^{20}$ to $3 \times 10^{21}$ atoms/cm$^3$. Note that, a Cs$^+$ ion source was used in the SIMS measurements.

Experimental Example 2

In Experimental Example 2 of the present invention, a substrate 1 for a thin-film photoelectric conversion device similar to that of Experimental Example 1 was manufactured. That is, the substrate of Experimental Example 2 was different from that of Experimental Example 1 only in that the mass concentration of spherical silica relative to the coating solution as a whole was changed from 6% to 2%.

Figure 7:
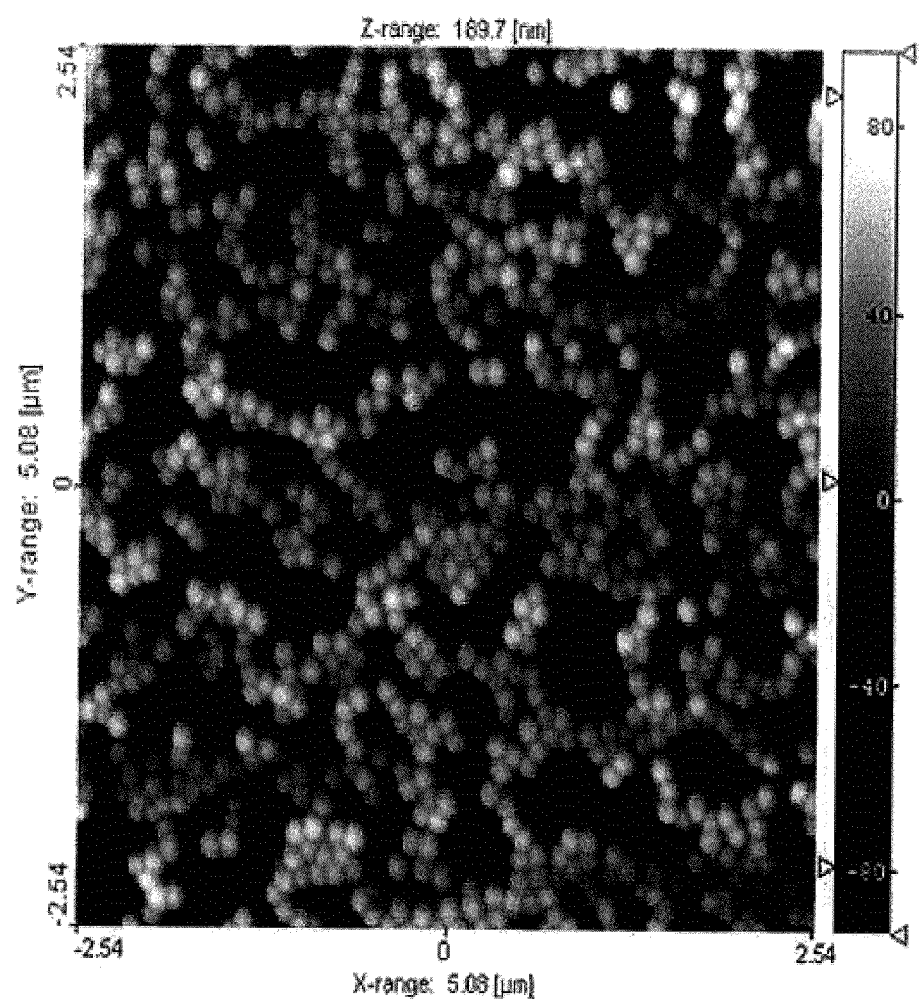
FIG. 7 is an AFM image showing a particle-covering state on a transparent insulating base member in Experimental Example 2.

FIG. 7, which is similar to FIG. 5, shows an AFM image of the upper surface of a transparent insulating base member 11 obtained in Experimental Example 2. In comparison with that of FIG. 5 of Experimental Example 1, in FIG. 7 of Experimental Example 2, gaps among the silica fine particles were clearly widened, and in this case, the coverage factor of particles was 49.3%.

Figure 8:
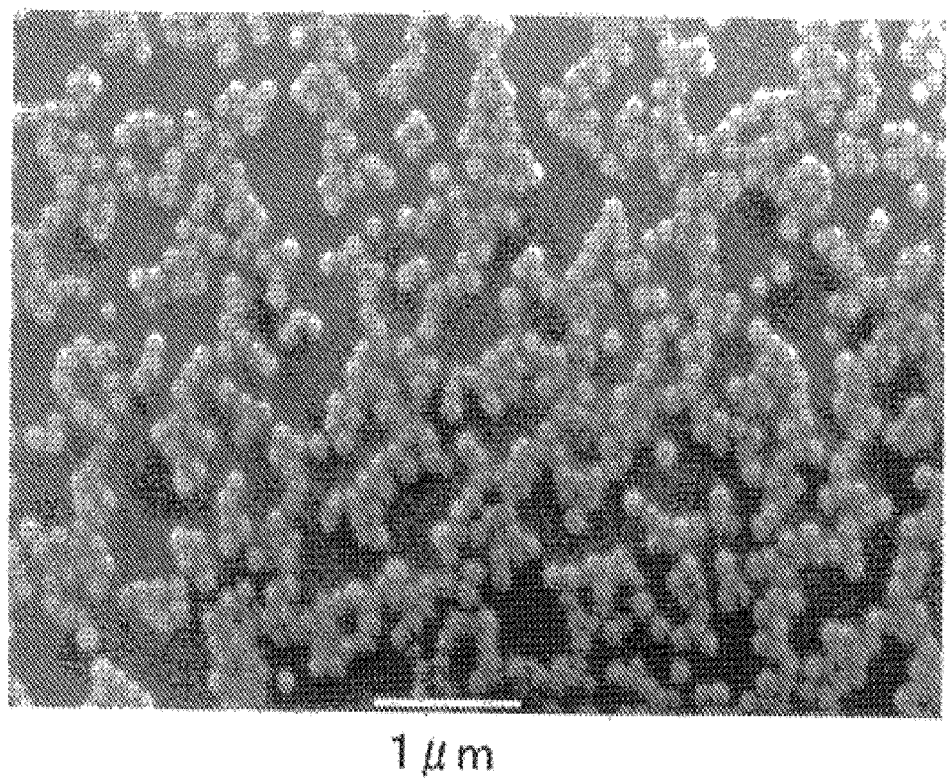
FIG. 8 is an SEM image showing a particle-covering state on the transparent insulating base member in Experimental Example 2.

As a reference, FIG. 8 shows an SEM image of the upper surface of the transparent insulating base member 11 obtained in Experimental Example 2. In the SEM image of FIG. 8 as well, the same particle distribution as that of the AFM image of FIG. 7 was observed.

On the transparent insulating base member 11 obtained in Experimental Example 2, a transparent electrode layer 12 made of ZnO was deposited in the same method as that of Experimental Example 1. As a result, in the ZnO film transparent electrode layer 12 obtained in Experimental Example 2, the thickness, obtained from interference of reflection spectra, was 1.7 μm, the sheet resistance was 11.1 Ω/square, the haze ratio, measured by using an illuminant C, was 22.2%, and the surface area ratio (Sdr), obtained by the AFM measurements, was 70.2%. Moreover, the H concentration of the ZnO transparent electrode layer 12, measured by the SIMS, was in a range from $9\times10^{20}$ to $3\times10^{21}$ atoms/cm$^3$.

Reference Example 1

In Reference Example 1, a substrate 1 for a thin-film photoelectric conversion device similar to that of Experimental Example 1 was manufactured. That is, the substrate of Reference Example 1 was different from that of Experimental Example 1 in that the average particle size of spherical silica was changed from 100 nm to 50 nm, and in that the mass concentration of spherical silica relative to the coating solution as a whole was changed from 6% to 4%.

The surface of the transparent insulating base member 11 obtained in Reference Example 1 was measured by AFM to find that the coverage factor of the particles was 98.9%.

On the transparent insulating base member 11 obtained in Reference Example 1, a transparent electrode layer 12 made of ZnO was deposited in the same method as that of Experimental Example 1. As a result, in the ZnO film transparent electrode layer 12 obtained in Reference Example 1, the thickness, obtained from interference of reflection spectra, was 1.7 μm, the sheet resistance was 10.1 Ω/square, the haze ratio, measured by using an illuminant C, was 26.8%, and the surface area ratio (Sdr), obtained by the AFM measurements, was 85.4%. Moreover, the H concentration of the ZnO transparent electrode layer 12, measured by the SIMS, was in a range from $9\times10^{20}$ to $3\times10^{21}$ atoms/cm$^3$.

Experimental Example 3

Figure 4:
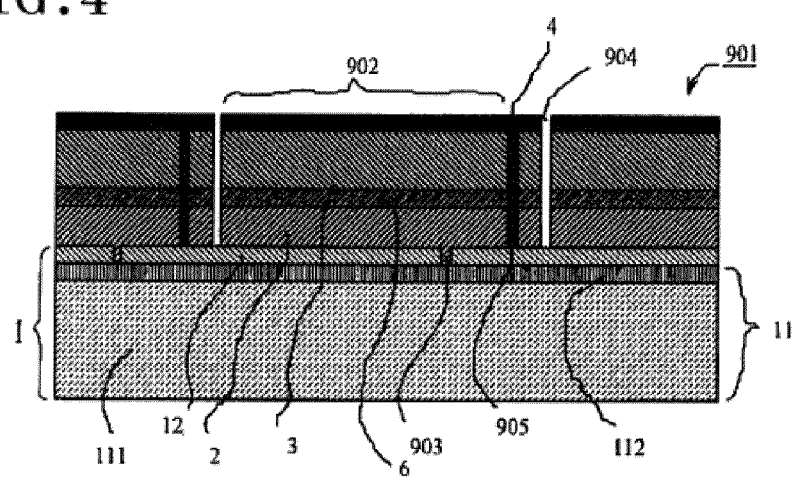
FIG. 4 is a schematic cross-sectional view showing an integrated-type thin-film photoelectric conversion module.

A stacked-type thin-film photoelectric conversion device 5, as shown in FIG. 3, was manufactured by utilizing the substrate 1 of Experimental Example 1, as Experimental Example 3 of the present invention. That is, in Experimental Example 3, a hybrid-type thin-film photoelectric conversion device was manufactured through processes in which, on the substrate 1 of Experimental Example 1, an amorphous silicon photoelectric conversion unit 2, an intermediate transmissive-reflective layer 6, a crystalline silicon photoelectric conversion unit 3 and a back electrode layer 4 were successively formed. In this case, the thin-film photoelectric conversion device of Experimental Example 3 was manufactured as an integrated-type thin-film photoelectric conversion module 901 as shown in FIG. 4, by utilizing a laser scribing process.

Upon forming the integrated-type thin-film photoelectric conversion module 901, a YAG (yttrium-aluminum-garnet) laser having a wavelength of 1064 nm was used so that separation grooves 903 were formed on a transparent electrode layer 12, and the resulting substrate 1 was then washed and dried.

On the transparent electrode layer 12 that had been laser-processed, a p-type layer 21 made of stacked layers of a p-type microcrystalline silicon layer having a thickness of 10 nm and a p-type amorphous silicon carbide layer having a thickness of 15 nm, an i-type amorphous silicon photoelectric conversion layer 22 having a thickness of 350 nm and an n-type microcrystalline silicon layer 23 having a thickness of 15 nm were successively stacked by using a plasma enhanced CVD method so that a front photoelectric conversion unit 2 was formed. Successively, an intermediate transmissive-reflective layer 6 made of a silicon-based composite layer having a thickness of 50 nm was formed by the plasma enhanced CVD method. Moreover, a p-type microcrystalline silicon layer 31 having a thickness of 15 nm, an i-type crystalline silicon photoelectric conversion layer 32 having a thickness of 2.5 μm and an n-type microcrystalline silicon layer 33 having a thickness of 15 nm were successively deposited by the plasma enhanced CVD method so that a rear photoelectric conversion unit 3 was formed.

Thereafter, by using the second harmonic (wavelength: 532 nm) of the YAG laser, connection grooves 905 penetrating the front photoelectric conversion unit 2, the intermediate transmissive-reflective layer 6 and the rear photoelectric conversion unit 3 were formed.

After the formation of the connection grooves 905, as a back electrode layer 4 on the rear photoelectric conversion unit 3, a ZnO layer 41 doped with Al having a thickness of 90 nm and an Ag layer 42 having a thickness of 200 nm were successively deposited by a sputtering method. At this time, each of the connection grooves 905 was filled with the back electrode layer.

Lastly, by using the second harmonic of the YAG laser, separation grooves 904 penetrating the front photoelectric conversion unit 2, the intermediate transmissive-reflective layer 6, the rear photoelectric conversion unit 3 and the back electrode layer 4 were formed.

The thin-film photoelectric conversion module 901 of Experimental Example 3 thus obtained was irradiated with light of 1.5 AM (air mass) at a quantity of light of 100 mW/cm$^2$ so that its output characteristic was measured, to obtain an open circuit voltage (Voc) of 1.334 V, a short circuit current density (Jsc) of 13.30 mA/cm$^2$, a fill factor (FF) of 0.710, and a conversion efficiency (Eff) of 12.59%.

Accordingly, it is found that, by utilizing the substrate 1 of Experimental Example 1 having a coverage factor of particles of 76.7%, which is within a range from 30% or more to less than 80%, a thin-film photoelectric conversion device having a high Eff exceeding 12% can be obtained.

Experimental Example 4

In Experimental Example 4 of the present invention, an integrated-type thin-film photoelectric conversion module similar to Experimental Example 3 was manufactured. That is, the integrated-type thin-film photoelectric conversion module of Experimental Example 4 was different from that of Experimental Example 3 only in that, not the substrate 1 of Experimental Example 1, but the substrate 1 of Experimental Example 2 was used to produce the module.

The output characteristic of the resulting thin-film photoelectric conversion module of Experimental Example 4 was measured in the same manner as in Experimental Example 3, to obtain a Voc of 1.331 V, a Jsc of 13.11 mA/cm$^2$, an FF of 0.728 and an Eff of 12.70%.

Upon comparison between Experimental Example 4 and Experimental Example 3, it is found that, even in the case of utilizing the substrate 1 having a coverage factor of particles of 49.3% that is lower than 76.7%, the Eff is improved from 12.59% to 12.70%.

Reference Example 2

In Reference Example 2, an integrated-type thin-film photoelectric conversion module similar to Experimental Example 3 was manufactured. That is, the integrated-type thin-film photoelectric conversion module of Reference Example 2 was different from that of Experimental Example 3 only in that, not the substrate 1 of Experimental Example 1, but the substrate 1 of Reference Example 1 was used to produce the module.

The output characteristic of the resulting thin-film photoelectric conversion module of Reference Example 2 was measured in the same manner as in Experimental Example 3, to obtain a Voc of 1.331 V, a Jsc of 12.93 mA/cm$^2$, an FF of 0.682 and an Eff of 11.55%.

Upon comparison between Reference Example 2 and Experimental Example 3, it is found that, in the case where the substrate 1 having a high coverage factor of particles of 98% that is higher than 80%, the Eff is lowered to 12% or less. When the results of a laser scribing process were observed by a microscope, in the case of Reference Example 2 having a high coverage factor of particles, portions with narrowed groove widths or portions having grooves incompletely formed were observed at a plurality of places in the separation grooves 904 and the connection grooves 905.

Reference Example 3

In Reference Example 3, an integrated-type thin-film photoelectric conversion module similar to Experimental Example 3 was manufactured. That is, the integrated-type thin-film photoelectric conversion module of Reference Example 3 was different from that of Experimental Example 3 only in that it was formed with the underlying layer 112 in the substrate 1 being omitted therefrom. That is, the coverage factor of particles of Reference Example 3 was set to 0%.

The output characteristic of the resulting thin-film photoelectric conversion module of Reference Example 3 was measured in the same manner as in Experimental Example 3, to obtain a Voc of 1.222 V, a Jsc of 12.35 mA/cm$^2$, an FF of 0.655 and an Eff of 9.89%.

When Reference Example 3 was compared with Experimental Examples 3 and 4, as well as Reference Example 2, it was found that, in the case where no underlying layer 112 was included in the substrate 1, any of the parameters of Voc, Jsc and FF were lowered, with the result that the Eff was reduced in particular. Moreover, in the case of Reference Example 3 in which no underlying layer 112 was included in the substrate 1, separations of the transparent electrode layer 12 were observed, with each separation groove 903 formed by a laser scribing process serving as a starting point, at a plurality of places; thus, it was confirmed that, when no underlying layer 112 was prepared, the adhesion of the transparent electrode layer 12 was lowered.

Experimental Example 5

In Experimental Example 5, an integrated-type thin-film photoelectric conversion module similar to Experimental Example 3 was manufactured. More specifically, the integrated-type thin-film photoelectric conversion module of Experimental Example 5 was different from that of Experimental Example 3 only in that it was formed with the mass concentration of spherical silica relative to the entire coating solution being changed from 6% to 1.5% and with the coverage factor of particles being changed from 76.7% to 43.9%.

The output characteristic of the resulting thin-film photoelectric conversion module of Experimental Example 5 was measured in the same manner as in Experimental Example 3, to obtain a Voc of 1.314 V, a Jsc of 13.45 mA/cm$^2$, an FF of 0.709 and an Eff of 12.53%.

Experimental Example 6

In still another Experimental Example 6, an integrated-type thin-film photoelectric conversion module similar to Experimental Example 3 was manufactured. More specifically, the integrated-type thin-film photoelectric conversion module of Experimental Example 6 was different from that of Experimental Example 3 only in that it was formed with the mass concentration of spherical silica relative to the entire coating solution being changed from 6% to 1% and with the coverage factor of particles being changed from 76.7% to 32.6%.

The output characteristic of the resulting thin-film photoelectric conversion module of Experimental Example 6 was measured in the same manner as in Experimental Example 3, to obtain a Voc of 1.310 V, a Jsc of 13.53 mA/cm$^2$, an FF of 0.699 and an Eff of 12.38%.

Reference Example 4

In still another Reference Example 4, an integrated-type thin-film photoelectric conversion module similar to Experimental Example 3 was manufactured. More specifically, the integrated-type thin-film photoelectric conversion module of Reference Example 4 was different from that of Experimental Example 3 only in that it was formed with the mass concentration of spherical silica relative to the entire coating solution being changed from 6% to 8% and with the coverage factor of particles being changed from 76.7% to 87.6%.

The output characteristic of the resulting thin-film photoelectric conversion module of Reference Example 4 was measured in the same manner as in Experimental Example 3, to obtain a Voc of 1.275 V, a Jsc of 13.39 mA/cm$^2$, an FF of 0.686 and an Eff of 11.70%. (Summary of Experimental Examples 3 to 6 and Reference Examples 2 to 4)

Figure 9:
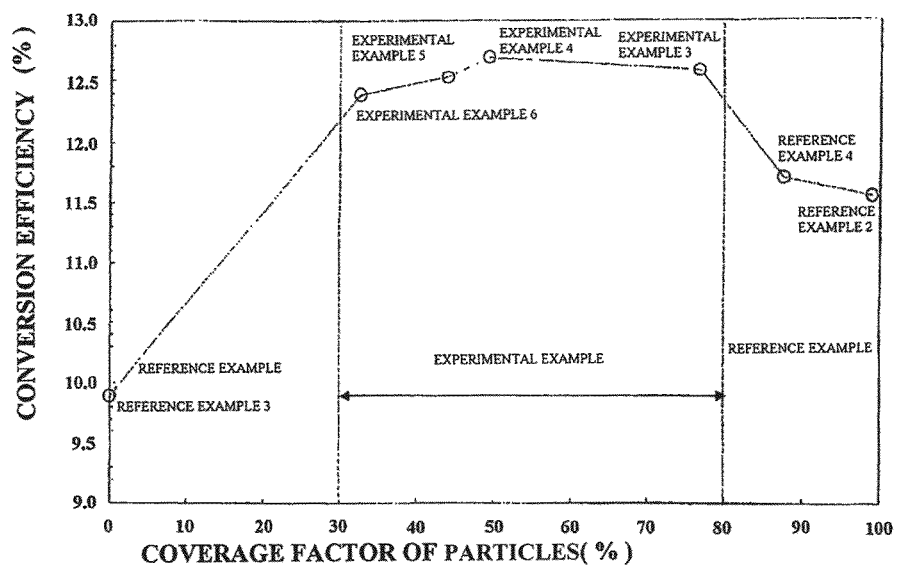
FIG. 9 is a graph showing a relationship between a conversion efficiency of an integrated-type thin-film photoelectric conversion module and a coverage factor of particles in a substrate for the module in accordance with Experimental Examples 3 to 6 and Reference Examples 2 to 4.

FIG. 9 is a graph showing the conversion efficiency Eff (%) of the hybrid-type thin-film photoelectric conversion module of the integrated type relative to the coverage factor (%) of particles of the underlying layer 112, with respect to Experimental Examples 3 to 6 and Reference Examples 2 to 4 described above. As can be understood from Experimental Examples 3 to 6 and Reference Examples 2 to 4, the coverage factor of particles of the underlying layer can be controlled by adjusting the particle size and mass % of spherical silica contained in the coating solution used for forming the underlying layer.

As can be clearly seen by FIG. 9, Eff exhibits a value higher than 12% when the coverage factor of particles of the underlying layer is in a range from 30% or more to 80% or less, and it is found that Experimental Examples 3 to 6 have coverage factors of particles within this range. That is, Reference Examples 2 to 4 have coverage factors of particles of 30% or less, or 80% or more, and in these cases, only the Eff less than 12% is obtained. Moreover, FIG. 9 shows that in a range from 44% or more to 77% or less of the coverage factors of particles, Eff exhibits a value higher than 12.5% or more. From these facts, it is understood that the coverage factor of particles of the underlying layer is desirably set in a range from 30% or more to less than 80%, more desirably, from 44% or more to 77% or less. Additionally, in FIG. 9, Eff has a maximum value in terms of the coverage factor of particles, and Eff becomes maximum at a coverage factor of particles of about 50%.

Experimental Example 7

In still another Experimental Example 7, a thin-film photoelectric conversion device including only one amorphous silicon photoelectric conversion unit (single cell) was manufactured. More specifically, in Experimental Example 7, a substrate 1 for a thin-film photoelectric conversion device was manufactured by using the same conditions as those of Experimental Example 1, except that a glass plate having a thickness of 0.7 mm and an area of 125 mm×125 mm was used, with the coating solution for forming the underlying layer 112 being applied thereto by using a small-size roll coater.

In Experimental Example 7, the coverage factor of particles of the underlying layer 112 was 73.8%. Further, with respect to the ZnO transparent electrode layer 12, its thickness, obtained from interference of reflection spectra, was 2.0 µm and the sheet resistance was 7.9 Ω/square. Moreover, the haze ratio of the substrate 1, measured by using an illuminant C, was 44.2%.

On the substrate 1 obtained in Experimental Example 7, an amorphous silicon photoelectric conversion unit 2 was formed. More specifically, the amorphous silicon photoelectric conversion unit 2 was formed by depositing a p-type microcrystalline silicon layer having a thickness of 10 nm, a p-type layer 21 made of an amorphous silicon carbide layer having a thickness of 15 nm, an i-type amorphous silicon photoelectric conversion layer 22 having a thickness of 300 nm and an n-type microcrystalline silicon layer 23 having a thickness of 30 nm successively by using a plasma enhanced CVD method.

On the amorphous photoelectric conversion unit 2, without a crystalline photoelectric conversion unit 3 being formed, an Al doped ZnO layer 41 having a thickness of 90 nm and an Ag layer 42 having a thickness of 200 nm were stacked thereon successively as a back electrode layer 4 by using a sputtering method.

Lastly, by processing the substrate by the use of the second harmonic (wavelength: 532 nm) of a YAG laser, a thin-film photoelectric conversion device having a light-receiving area of 10 mm×10 mm was manufactured.

The thin-film photoelectric conversion device of Experimental Example 7 thus obtained was irradiated with light of 1.5 AM at a quantity of light of 100 mW/cm$^2$ so that its output characteristic was measured, to obtain a Voc of 0.875 V, a Jsc of 15.94 mA/cm$^2$, an FF of 0.687, and an Eff of 9.57%.

Experimental Example 8

In another Experimental Example 8, a thin-film photoelectric conversion device with a single cell similar to that of Experimental Example 7 was manufactured. More specifically, the thin-film photoelectric conversion device of Experimental Example 8 was different from that of Experimental Example 7 only in that it was manufactured, with the mass concentration of spherical silica in the coating solution used for forming the underlying layer being changed from 6% to 1%.

In Experimental Example 8, the coverage factor of particles of the underlying layer 112 was 34.3%. Further, with respect to the ZnO transparent electrode layer 12, its thickness was 2.0 µm and the sheet resistance was 6.352/square. Moreover, the haze ratio of the substrate 1, measured by using an illuminant C, was 40.7%.

The thin-film photoelectric conversion device of Experimental Example 8 thus obtained was irradiated with light of 1.5 AM at a quantity of light of 100 mW/cm$^2$ so that its output characteristic was measured, to obtain a Voc of 0.879 V, a Jsc of 15.78 mA/cm$^2$, an FF of 0.689, and an Eff of 9.56%.

Reference Example 5

In Reference Example 5, a thin-film photoelectric conversion device having a single cell similar to Experimental Example 7 was manufactured. More specifically, the thin-film photoelectric conversion device of Reference Example 5 was different from that of Experimental Example 7 only in that it was formed with the mass concentration of spherical silica to be used for forming the underlying layer relative to the entire coating solution being changed from 6% to 9%.

In Reference Example 5, the coverage factor of particles of the underlying layer 112 was 93.8%. Further, the thickness of the ZnO transparent electrode layer 12 was 2.01 µm and the sheet resistance was 5.8 Ω/square. Moreover, the haze ratio of the substrate 1, measured by using an illuminant C, was 41.8%.

The thin-film photoelectric conversion device of Reference Example 5 thus obtained was irradiated with light of 1.5 AM at a quantity of light of 100 mW/cm$^2$ so that its output characteristic was measured, to obtain a Voc of 0.870 V, a Jsc of 15.88 mA/cm$^2$, an FF of 0.639, and an Eff of 8.84%.

Reference Example 6

In Reference Example 6, a thin-film photoelectric conversion device having a single cell similar to Experimental Example 7 was manufactured. More specifically, the thin-film photoelectric conversion device of Reference Example 6 was different from that of Experimental Example 7 only in that it was formed with the mass concentration of spherical silica in the coating solution to be used for forming the underlying layer being changed from 6% to 11%.

In Reference Example 6, the coverage factor of particles of the underlying layer 112 was 94.5%. Further, the thickness of the ZnO transparent electrode layer 12 was 2.0 µm and the sheet resistance was 5.1 Ω/square. Moreover, the haze ratio of the substrate 1, measured by using an illuminant C, was 38.2%.

The thin-film photoelectric conversion device of Reference Example 6 thus obtained was irradiated with light of 1.5 AM at a quantity of light of 100 mW/cm$^2$ so that its output characteristic was measured, to obtain a Voc of 0.792 V, a Jsc of 15.39 mA/cm$^2$, an FF of 0.612, and an Eff of 7.45%.

Reference Example 7

In Reference Example 7, a thin-film photoelectric conversion device having a single cell similar to Experimental Example 7 was manufactured. More specifically, the thin-film photoelectric conversion device of Reference Example 7 was different from that of Experimental Example 7 only in that it was formed with the mass concentration of spherical silica in the coating solution to be used for forming the underlying layer being changed from 6% to 0.5%.

In Reference Example 7, the coverage factor of particles of the underlying layer 112 was 12.4%. Further, the thickness of the ZnO transparent electrode layer 12 was 2.0 μm and the sheet resistance was 7.2 Ω/square. Moreover, the haze ratio of the substrate 1, measured by using an illuminant C, was 23.4%.

The thin-film photoelectric conversion device of Reference Example 7 thus obtained was irradiated with light of 1.5 AM at a quantity of light of 100 mW/cm$^2$ so that its output characteristic was measured, to obtain a Voc of 0.872 V, a Jsc of 14.68 mA/cm$^2$, an FF of 0.643, and an Eff of 8.23%.

Summary of Experimental Examples 7 and 8 and Reference Examples 5 to 7

Upon comparison between Experimental Examples 7 and 8 and Reference Examples 5 to 7, it is found that, in the case of Experimental Examples 7 and 8 with its coverage factor of particles of the underlying layer 112 being set in a range from 30% or more to 80% or less, an Eff of 9.5% or more that was comparatively high as a single cell including an amorphous silicon photoelectric conversion layer was obtained. In contrast, in the case of Reference Example 5 with its coverage factor of particles being set to 93.8 that exceeded 80%, first, the FF was mainly reduced to cause a reduction of Eff to 8.84%. Moreover, in the case of Reference Example 6 with its coverage factor of particles being increased to 94.5%, it was found that any of the values of FF, Voc and Jsc were greatly reduced, with the result that the Eff was greatly reduced to 7.45%. In contrast, in Reference Example 8 with its coverage factor of particles being set to 12.4% that is 30% or less, the Jsc and FF were mainly reduced to cause a reduction of Eff to 8.23%. From these facts, it can be said that, also in a thin-film photoelectric conversion device including only a single cell, without having an integrated structure, the coverage factor of particles is desirably set in a range from 30% or more to 80% or less.

Experimental Example 9

Example 1

A substrate for a thin-film photoelectric conversion device was manufactured as Experimental Example 9 of the present invention. More specifically, in a cross-sectional view of a thin-film photoelectric conversion device of FIG. 10, the substrate for a thin-film photoelectric conversion device corresponding to a portion denoted with A was manufactured. On an antireflection surface 1112 of a transparent base member 111 of a glass substrate having a thickness of 4 min and a size of 360 mm×465 mm, a transparent antireflection layer 113 containing SiO$_2$ fine particles 1131 and a binder 1132 was formed, and on an underlying surface 1111 of the transparent base member 111, a transparent underlying layer 112 containing SiO$_2$ fine particles 1121 and a binder 1122 was formed so that a transparent insulating substrate base member 11A was prepared.

Upon forming the transparent antireflection layer 113 and the transparent underlying layer 112, first, the glass substrate was subjected to a Cerico washing process. More specifically, water was absorbed in a polishing buff in which cerium oxide was fixed onto a sponge made of polyvinyl alcohol, and by pressing this onto the transparent base member, the Cerico washing process was carried out at a revolution of 2000 rpm and a moving rate of 30 mm/sec. At this time, the washing process was carried out with a pressing pressure onto the underlying surface being set to 2 kgf and with a pressing pressure onto the antireflection surface that was one main surface different from the underlying surface being set to 4 kgf. The substrate was rinsed with pure water and washed. Thereafter, the substrate was dried at 80° C. for 30 minutes.

A coating solution to be used upon forming the transparent antireflection layer 113 and the transparent underlying layer 112 was prepared by stirring and mixing water, isopropyl alcohol, hydrochloric acid, oligomer (n=4 to 6) of tetraethoxy silane, and a dispersion solution of silica fine particles (water solvent, solid component: 40%) having an average particle size of 90 nm. By using a dip coating method in which the glass substrate was immersed in this coating solution and pulled out at a rate of 0.115 msec, coating processes of the transparent antireflection layer 113 and the transparent underlying layer 112 were simultaneously carried out. Thereafter, the substrate was subjected to a baking process at 200° C. for 5 minutes so that a transparent insulating base member 11A having fine unevenness formed on its surface was obtained.

Figure 14:
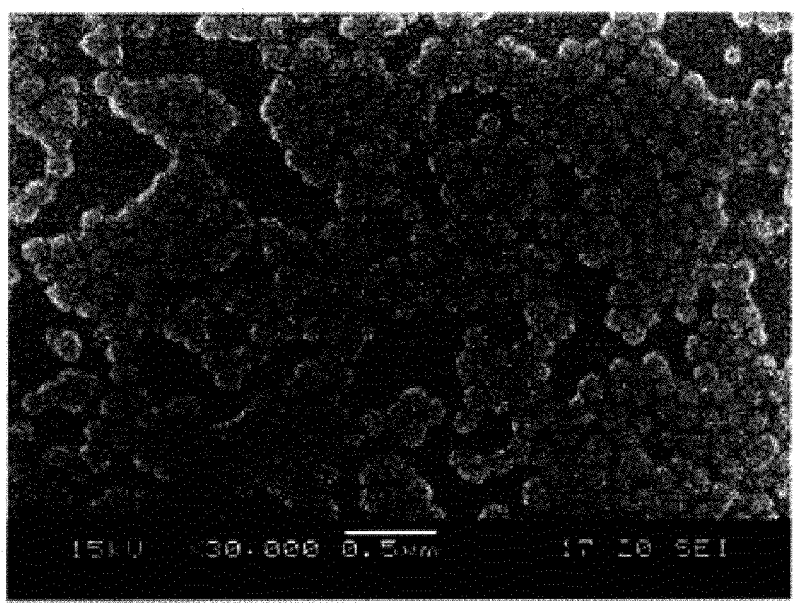
FIG. 14 is an SEM image showing a particle-covering state on an underlying layer of a transparent insulating base member in accordance with Experimental Example 9 (Example 1).
Figure 15:
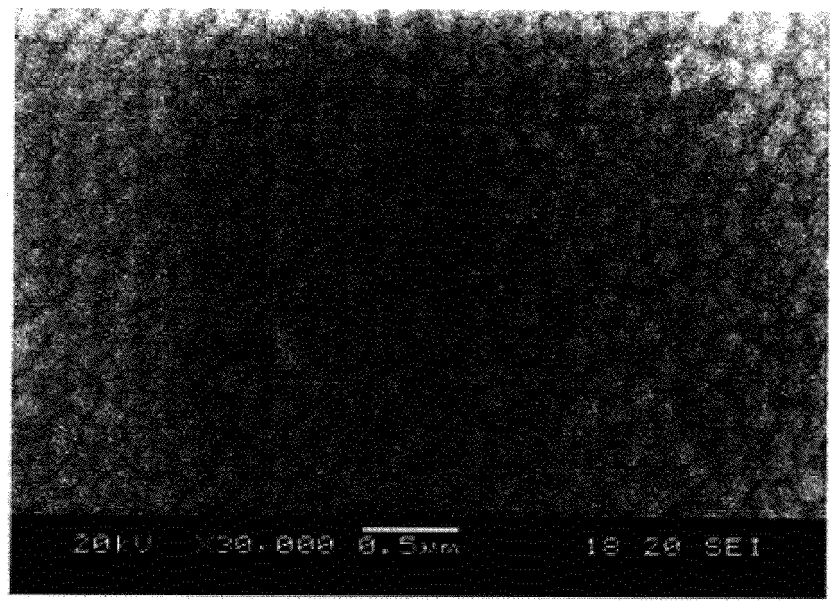
FIG. 15 is an SEM image showing a particle-covering state on an antireflection layer of the transparent insulating base member in accordance with Experimental Example 9 (Example 1).

FIG. 14 shows an image of the underlying layer of the resulting transparent insulating base member 11A observed by a scanning electron microscope (SEM). FIG. 15 shows an image of an antireflection layer of the transparent insulating base member 11A observed by a scanning electron microscope (SEM).

Figure 18:
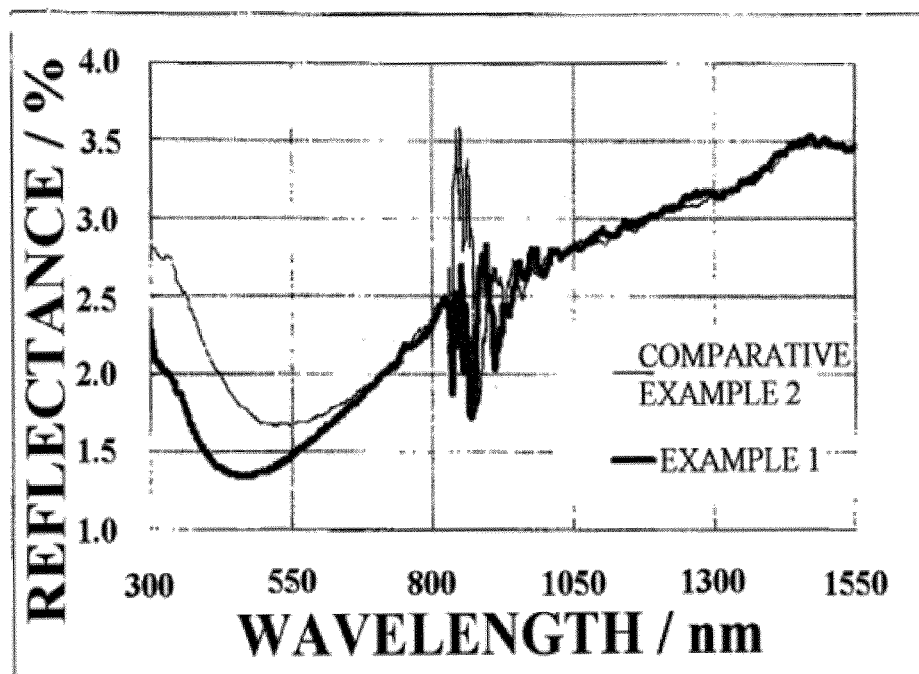
FIG. 18 shows a reflectance of the antireflection surface on the transparent insulating substrate in accordance with Experimental Example 9 (Example 1) and Comparative Example 2.

In particular, in FIG. 14, gaps were observed among the particles of SiO$_2$. At this time, the coverage factor of particles of the underlying layer shown in FIG. 14 was 62.4%, and the coverage factor of particles of the antireflection layer shown in FIG. 15 was 91.1%. FIG. 18 shows the reflectance of the antireflection layer of Experimental Example 9 (Example 1) relative to wavelengths of light. The reflectance of the antireflection layer had a minimum value of 1.35% at a wavelength of 452 nm.

In addition, when the side surfaces of the transparent insulating substrate were observed by a scanning electron microscope (SEM), particles of SiO$_2$ were observed. In this case, when a film-unformed portion (an end portion of the main surface) within the transparent insulating substrate corresponding to the periphery of a supporting portion at the time of the dip coating process was observed by the scanning electron microscope (SEM), no particles of SiO$_2$ were observed. Moreover, in this method, it was observed that "a lower end portion (main-surface end portion) on the side opposite to the film-unformed portion (upper end portion)" had multiple layers of particles of SiO$_2$ in comparison with a center portion of the substrate.

On the transparent insulating base member 11A thus obtained, a transparent electrode layer 12 made of ZnO was formed by using a low-pressure CVD method so that a thin-film photoelectric conversion substrate 1A was obtained. This transparent electrode layer 12 was formed under conditions of a substrate temperature of 150° C., a pressure of 30 Pa, a flow-rate of vaporized diethyl zinc (DEZ) of 200 sccm, a flow-rate of vaporized water of 700 sccm, a flow-rate of vaporized diborane (B$_2$H$_6$) of 2 sccm and a flow-rate of hydrogen of 1000 sccm.

In the resulting transparent electrode layer 12 made of a ZnO film, the thickness, obtained from interference of reflection spectra, was 1.8 μm, the sheet resistance was 11.9 Ω/square, and the haze ratio, measured by using an illuminant C, was 30.3%.

Experimental Example 10

Example 2

Figure 16:
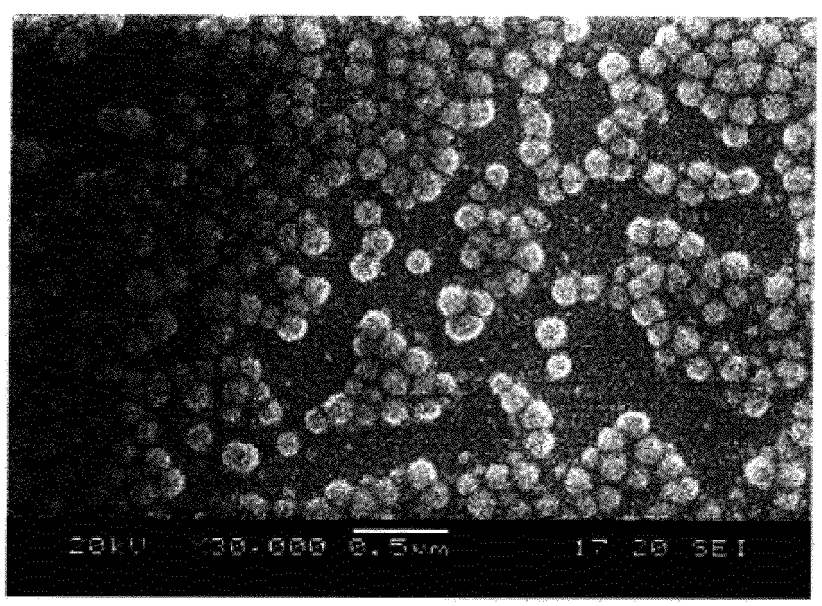
FIG. 16 is an SEM image showing a particle-covering state on an underlying layer of a transparent insulating base member in accordance with Experimental Example 10 (Example 2).
Figure 17:
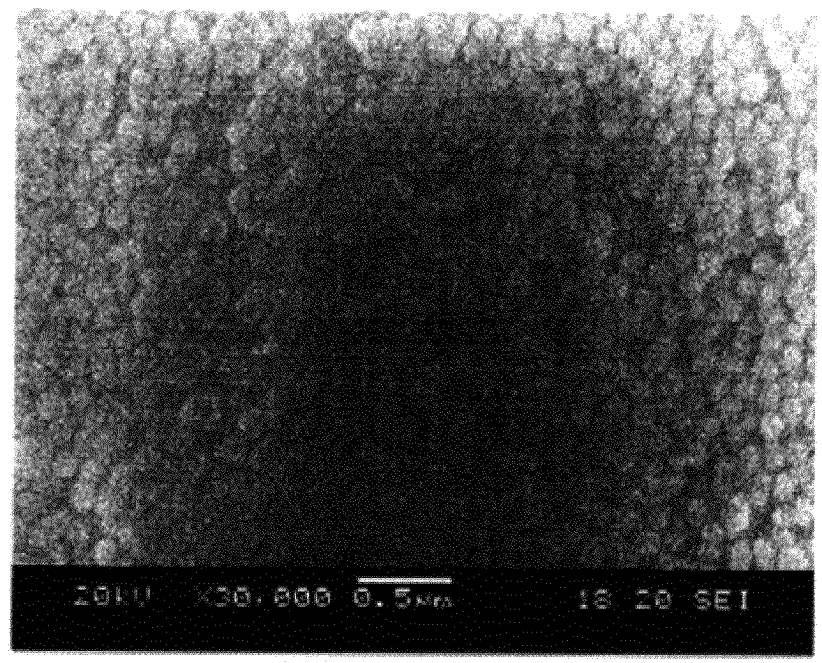
FIG. 17 is an SEM image showing a particle-covering state on an antireflection layer of the transparent insulating base member in accordance with Experimental Example 10 (Example 2).

A substrate for a thin-film photoelectric conversion device was manufactured as Experimental Example 10 of the present invention. The same structure and manufacturing method as those of Experimental Example 9 were used except that conditions of washing processes were different from those of Experimental Example 9. More specifically, the Experimental Example 10 was different from Experimental Example 9 (Example 1) in that only the antireflection surface was subjected to the Cerico washing, and the antireflection surface and the underlying surface were then rinsed with pure water and washed. FIG. 16 shows an image obtained by observing the underlying layer of the transparent insulating base member 11A by the use of a scanning electron microscope (SEM). FIG. 17 shows an image obtained by observing the antireflection layer of the transparent insulating base member 11A by the use of a scanning electron microscope (SEM). In comparison with Experimental Example 9 (Example 1), gaps among the silica particles of the underlying layer became bigger. At this time, the coverage factor of particles of the underlying layer shown in FIG. 16 was 43.6%, and the coverage factor of particles of the antireflection layer shown in FIG. 17 was 94.3%. The reflectance of the antireflection layer had a minimum value of 1.38% at a wavelength of 447 nm.

On the resulting transparent insulating base member 11A, a transparent electrode layer 12 made of ZnO was formed in the same method as that of Experimental Example 9 (Example 1) so that a substrate 1A for a thin-film photoelectric conversion device was obtained. In the resulting transparent electrode layer 12 made of a ZnO film, the thickness, obtained from interference of reflection spectra, was 1.8 µm. The sheet resistance thereof was 11.8 Ω/square. The haze ratio, measured by using an illuminant C, was 38.0%.

Comparative Example 1

Figure 12:
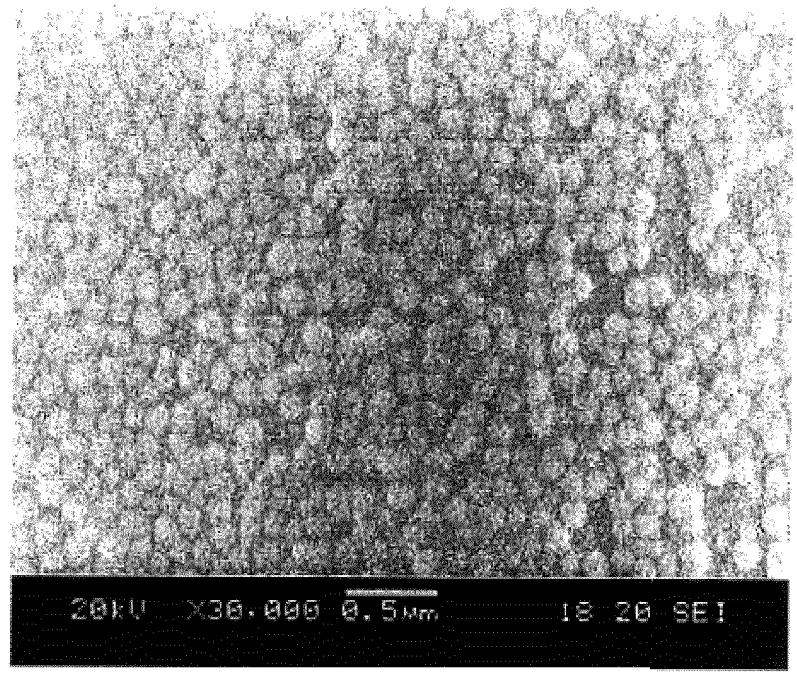
FIG. 12 is an SEM image showing a particle-covering state on an underlying layer of a transparent insulating base member in accordance with Comparative Example 1.
Figure 13:
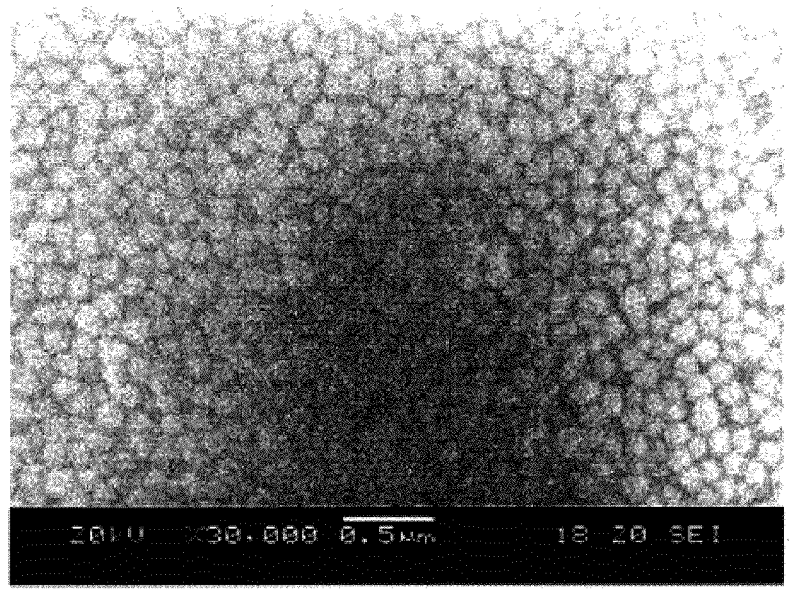
FIG. 13 is an SEM image showing a particle-covering state on an antireflection layer of a transparent insulating base member in accordance with Comparative Example 1.

A substrate for a thin-film photoelectric conversion device was manufactured as Comparative Example 1. The same structure and manufacturing method as those of Experimental Example 9 (Example 1) were used except that the pressing force onto the underlying surface was set to 4 kgf in the Cerico washing process. FIG. 12 shows an image of the surface of the underlying layer of this transparent insulating base member 11A observed by a scanning electron microscope (SEM). FIG. 13 shows an image of the surface of the antireflection layer of the transparent insulating base member 11A observed by a scanning electron microscope (SEM). The underlying layer and the antireflection layer were densely filled with silica particles without gaps among them. At this time, the coverage factor of particles of the underlying layer shown in FIG. 12 was 92.8%, and the coverage factor of particles of the antireflection layer shown in FIG. 13 was 99.6%. The reflectance of the antireflection layer had a minimum value of 1.39% at a wavelength of 454 nm.

On the transparent insulating base member 11A thus obtained, a transparent electrode layer 12 made of ZnO was formed in the same method as that of Experimental Example 9 (Example 1) so that a substrate for a thin-film photoelectric conversion device was obtained. The thickness of the resulting transparent electrode layer 12 made of ZnO, obtained from interference of reflection spectra, was 1.8 µm. The sheet resistance was 11.9 Ω/square. The haze ratio, measured by using an illuminant C, was 19.9%.

Comparative Example 2

A substrate for a thin-film photoelectric conversion device was manufactured as Comparative Example 2. The same structure and manufacturing method as those of Experimental Example 9 (Example 1) were used except that the pressing force onto the underlying surface and the antireflection surface was set to 1 kgf in the Cerico washing process. At this time, the coverage factor of particles of the underlying layer was 57.8%, and the coverage factor of particles of the antireflection layer was 51.5%. FIG. 18 shows the reflectance of the antireflection surface of Comparative Example 2 relative to wavelengths of light. The reflectance of the antireflection surface had a minimum value of 1.67% at a wavelength of 520 nm.

On the transparent insulating base member 11A thus obtained, a transparent electrode layer 12 made of ZnO was formed in the same method as that of Experimental Example 9 so that a substrate for a thin-film photoelectric conversion device was obtained. The thickness of the resulting transparent electrode layer 12 made of a ZnO film, obtained from interference of reflection spectra, was 1.8 µm. The sheet resistance was 12.1 Ω/square. The haze ratio, measured by using an illuminant C, was 35.1%.

Experimental Example 11

Example 3

As Experimental Example 11 (Example 3) of the present invention, an integrated-type thin-film photoelectric conversion module was manufactured by using the substrate for a thin-film photoelectric conversion device of Experimental Example 9 (Example 1). The same structure and manufacturing method for the thin-film photoelectric conversion module as those of Experimental Example 3 were used except for the substrate for a thin-film photoelectric conversion device. The output characteristics of the resulting thin-film photoelectric conversion module of Experimental Example 11 (Example 3) were measured, to obtain a Voc of 1.327 V, a Jsc of 13.70 mA/cm$^2$, an FF of 0.721 and an Eff of 13.11%.

Experimental Example 12

Example 4

As Experimental Example 12 (Example 4) of the present invention, an integrated-type thin-film photoelectric conversion module was manufactured by using the substrate for a thin-film photoelectric conversion device of Experimental Example 10 (Example 2). The same structure and manufacturing method for the thin-film photoelectric conversion module as those of Experimental Example 3 were used except for the substrate for a thin-film photoelectric conversion device. The output characteristics of the resulting thin-film photoelectric conversion module of Experimental Example 12 (Example 4) were measured, to obtain a Voc of 1.332 V, a Jsc of 13.89 mA/cm$^2$, an FF of 0.728 and an Eff of 13.47% were obtained.

Comparative Example 3

As Comparative Example 3 of a conventional method, an integrated-type thin-film photoelectric conversion module was manufactured by using the substrate for a thin-film photoelectric conversion device of Comparative Example 1. The same structure and manufacturing method for the thin-film photoelectric conversion module as those of Experimental Example 3 were used except for the substrate for a thin-film photoelectric conversion device. The output characteristics of the resulting thin-film photoelectric conversion module of Comparative Example 3 were measured, to obtain a Voc of 1.298 V, a Jsc of 11.96 mA/cm², an FF of 0.682 and an Eff of 10.59%.

Comparative Example 4

As Comparative Example 4 of a conventional method, an integrated-type thin-film photoelectric conversion module was manufactured by using the substrate for a thin-film photoelectric conversion device of Comparative Example 2. The same structure and manufacturing method for the thin-film photoelectric conversion module as those of Experimental Example 3 were used except for the substrate for a thin-film photoelectric conversion device. The output characteristics of the resulting thin-film photoelectric conversion module of Comparative Example 4 were measured, to obtain a Voc of 1.312 V, a Jsc of 12.65 mA/cm², an FF of 0.715 and an Eff of 11.87%.

Summary of Experimental Examples 11 and 12 (Examples 3 and 4) and Comparative Examples 3 and 4

Upon comparison between Experimental Examples 11 and 12 and Comparative Examples 3 and 4, it is found that, in the case of Experimental Examples 11 and 12 (Examples 3 and 4) with its coverage factor of particles of the underlying layer 112 being set in a range from 30% or more to 80% or less and with its coverage factor of particles of the antireflection layer 113 being set to 80% or more, an Eff of 13.0% or more that was comparatively high as an integrated-type thin-film photoelectric conversion module was obtained. In contrast, in the case of Comparative Example 3 with its coverage factor of particles of the underlying layer being set to 92.8% exceeding 80% and with its coverage factor of particles of the antireflection layer 113 being set to 99.6% exceeding 80%, any of the FF, Voc and Jsc were greatly reduced to cause a great reduction of Eff to 10.59%. On the other hand, in the case of Comparative Example 4 with its coverage factor of particles of the underlying layer 112 being set to 57.8% that is in a range from 30% or more to 80% or less and with its coverage factor of particles of the antireflection layer 113 being set to 51.5% that is less than 80%, the value of Jsc was mainly reduced, with the result that the Eff was greatly reduced to 11.87%. From these facts, it can be said that, in an integrated-type thin-film photoelectric conversion module, the coverage factor of particles of the underlying layer is desirably set in a range from 30% or more to 80% or less, with the coverage factor of particles of the antireflection layer being desirably set to 80% or more.

Experimental Example 13

Example 5

As Experimental Example 13 (Example 5) of the present invention, a substrate for a thin-film photoelectric conversion device similar to that of Experimental Example 1 was manufactured. More specifically, Experimental Example 13 was different from Experimental Example 1 only in that, although it had the transparent underlying layer formed in the same manner as Experimental Example 1, the antireflection layer was formed on a main surface on the side opposite to the underlying layer of the glass substrate 111 by using a different coating solution. The coating solution and the coating method thereof were different from those of Experimental Example 1 only in that the mass concentration of spherical silica relative to the entire coating solution was set to 6% on the underlying layer, and also to 10% on the antireflection layer, and the other conditions were the same as those of Experimental Example 1. At this time, the coverage factor of particles of the underlying layer was 72.1%, and the coverage factor of particles of the antireflection layer was 95.2%. The reflectance of the antireflection layer had a minimum value of 1.34% at a wavelength of 460 nm.

On the transparent insulating base member 11A thus obtained, a transparent electrode layer 12 made of ZnO was formed by using the same method as that of Experimental Example 9 so that a thin-film photoelectric conversion substrate 1A was obtained. In the resulting transparent electrode layer 12 made of a ZnO film, the thickness, obtained from interference of reflection spectra, was 1.8 μm. The sheet resistance was 11.3 Ω/square. The haze ratio, measured by using an illuminant C, was 32.1%.

Experimental Example 14

Example 6

As Experimental Example 14 (Example 6) of the present invention, an integrated-type thin-film photoelectric conversion module was manufactured by using the substrate for a thin-film photoelectric conversion device of Experimental Example 13. The same structure and manufacturing method for the thin-film photoelectric conversion module as those of Experimental Example 3 were employed except for the substrate for a thin-film photoelectric conversion device. The output characteristics of the resulting thin-film photoelectric conversion module of Experimental Example 14 were measured, to obtain a Voc of 1.329 V, a Jsc of 13.65 mA/cm², an FF of 0.736 and an Eff of 13.35%.

Comparative Example 5

A substrate for a thin-film photoelectric conversion device was manufactured as Comparative Example 5. The same structure and manufacturing method as those of Experimental Example 14 were used except that the mass concentration of spherical silica of the coating solution was set to 10% in the underlying layer and the antireflection layer. At this time, the coverage factor of particles on the underlying surface was 95.3%, and the coverage factor of particles on the antireflection surface was 95.1%. The reflectance of the antireflection surface had a minimum value of 1.33% at a wavelength of 453 nm.

On the resulting transparent insulating base member 11A, a transparent electrode layer 12 made of ZnO was formed by using the same method as that of Experimental Example 9 so that a substrate 1A for a thin-film photoelectric conversion device was obtained. In the resulting transparent electrode layer 12 made of a ZnO film, the thickness, obtained from interference of reflection spectra, was 1.8 μm. The sheet resistance thereof was 11.4 Ω/square. The haze ratio, measured by using an illuminant C, was 25.3%.

Comparative Example 6

An integrated-type thin-film photoelectric conversion module was manufactured by using the substrate for a thin-film photoelectric conversion device of Comparative Example 5, as Comparative Example 6. The same structure and manufacturing method as those of Experimental Example 3 were used except for the substrate for a thin-film photoelectric conversion device. The output characteristics of the resulting thin-film photoelectric conversion module of Comparative Example 6 were measured, to obtain a Voc of 1.285 V, a Jsc of 13.10 mA/cm$^2$, an FF of 0.672 and an Eff of 11.31%.

Summary of Experimental Example 14 (Example 6) and Comparative Example 6

Upon comparison between Experimental Example 14 and Comparative Example 6, it is found that, in the case of Experimental Example 14 with its coverage factor of particles of the underlying layer 112 being set in a range from 30% or more to 80% or less and with its coverage factor of particles of the antireflection layer 113 being set to 80% or more, an Eff of 13.0% or more that was comparatively high as an integrated-type thin-film photoelectric conversion module was obtained. In contrast, in Comparative Example 6 with its coverage factor of particles of the underlying layer 112 being set to 95.3% exceeding 80% and with its coverage factor of particles of the antireflection layer 113 being set to 95.1% exceeding 80%, the FF and Voc were mainly reduced to cause a great reduction of Eff to 11.31%. From these facts, it can be said that, also in an integrated-type thin-film photoelectric conversion module on which an underlying layer and an antireflection layer were formed by using a printing method, the coverage factor of particles of the underlying layer is desirably set in a range from 30% or more to 80% or less, with the coverage factor of particles of the antireflection layer being desirably set to 80% or less.

INDUSTRIAL APPLICABILITY

As described above, in accordance with the present invention, there is provided a substrate on which a ZnO transparent electrode layer included in a thin-film photoelectric conversion device is deposited by using a low-pressure thermal CVD method, and by using such a substrate, it becomes possible to provide a cost reductive thin-film photoelectric conversion device with improved photoelectric conversion efficiency.

DESCRIPTION OF REFERENCE NUMERALS

| | |
|---|---|
| 1, 1A: | Substrate for thin-film photoelectric conversion device |
| 11, 11A: | Transparent insulating base member |
| 111: | Transparent base member |
| 1111: | Underlying surface |
| 1112: | Antireflection surface |
| 112: | Transparent underlying layer |
| 1121: | Transparent fine particle |
| 1122: | Transparent binder |
| 113: | Transparent antireflection layer |
| 1131: | Transparent fine particle |
| 1132: | Transparent binder |
| 12: | Transparent electrode layer |
| 2: | Front photoelectric conversion unit |
| 21: | One-conductivity-type layer |
| 22: | Photoelectric conversion layer |
| 23: | Opposite-conductivity-type layer |
| 3: | Rear photoelectric conversion unit |
| 31: | One-conductivity-type layer |
| 32: | Photoelectric conversion layer |
| 33: | Opposite-conductivity-type layer |
| 4: | Back electrode layer |
| 41: | Conductive oxide layer |
| 42: | Metal layer |
| 5: | Thin-film photoelectric conversion device |
| 6: | Intermediate transmissive-reflective layer |
| 901: | Integrated-type thin-film photoelectric conversion module |
| 902: | Photoelectric conversion cell |
| 903: | First separation groove |
| 904: | Second separation groove |
| 905: | Connection groove |

The invention claimed is:

1. A method for manufacturing a substrate for a thin-film photoelectric conversion device, comprising the steps of:
    providing a transparent base member;
    washing the transparent base member;
    forming a transparent underlying layer on an underlying surface serving as one main surface of the transparent base member, the transparent underlying layer including transparent insulating fine particles having an average particle size in a range from 50 nm to 200 nm and a transparent binder, the transparent insulating fine particles in the transparent underlying layer being dispersed so as to cover the underlying surface with a coverage factor of particles in a range from 30% or more to less than 80%;
    forming an antireflection layer on an antireflection surface serving as another main surface on a side opposite to the underlying surface of the transparent base member, the antireflection layer including transparent insulating fine particles and a transparent binder, the transparent insulating fine particles in the antireflection layer being dispersed so as to cover the antireflection layer with a coverage factor of particles being greater than the coverage factor in the underlying layer; and
    disposing a transparent electrode layer containing zinc oxide on the transparent underlying layer by using a low-pressure CVD method, wherein
    after the step of washing the transparent base member, the transparent underlying layer and the antireflection layer are formed simultaneously by using a dipping method, and wherein
    in the step of washing the transparent base member, each of the underlying surface and the antireflection surface of the transparent base member are washed, and conditions for washing the underlying surface of the transparent base member and conditions for washing the antireflection surface of the transparent base member are made different from each other.

2. The method for manufacturing the substrate for a thin-film photoelectric conversion device according to claim 1, wherein the transparent insulating fine particles in the antireflection layer are dispersed so as to cover the underlying surface with a coverage factor of particles of 80% or more.

3. The method for manufacturing the substrate for a thin-film photoelectric conversion device according to claim 1, wherein both of the underlying surface and the antireflection surface are subjected to a Cerico washing process, with a pressing force applied onto the antireflection surface upon washing the antireflection surface being made greater than a pressing force applied onto the underlying surface upon washing the underlying surface.

4. The method for manufacturing the substrate for a thin-film photoelectric conversion device according to claim 3, wherein the Cerico washing process is carried out by using a polishing buff that is impregnated with cerium oxide particles.

5. The method for manufacturing the substrate for a thin-film photoelectric conversion device according to claim 1, wherein washing the underlying surface of the transparent base member is carried out only by rinsing the underlying surface with pure water, and washing the antireflection surface of the transparent base member is carried out by using a Cerico washing process.

6. The method for manufacturing the substrate for a thin-film photoelectric conversion device according to claim 5, wherein the Cerico washing process is carried out by using a polishing buff that is impregnated with cerium oxide particles.

7. A method for manufacturing a thin-film photoelectric conversion device comprising the steps of:
providing a substrate for a thin-film photoelectric conversion device by the method according to claim 1; and
forming one or more photoelectric conversion units on the transparent electrode layer.

8. The method for manufacturing the thin-film photoelectric conversion device according to claim 7, wherein the one or more photoelectric conversion units include an amorphous photoelectric conversion unit.

9. The method for manufacturing the thin-film photoelectric conversion device according to claim 7, wherein the one or more photoelectric conversion units include a crystalline photoelectric conversion unit.

10. A method for manufacturing a thin-film photoelectric conversion device comprising the steps of:
providing a substrate for a thin-film photoelectric conversion device by the method according to claim 1; and
forming one or more photoelectric conversion unit layers and a back electrode layer successively on the transparent electrode layer, wherein
the transparent electrode layer, the photoelectric conversion unit layers and the back electrode layer are separated from one another by a plurality of separation grooves so as to form a plurality of photoelectric conversion cells, and the respective photoelectric conversion cells are electrically serially-connected to one another through a plurality of connection grooves.

* * * * *